(12) United States Patent
Azami

(10) Patent No.: US 7,053,918 B2
(45) Date of Patent: May 30, 2006

(54) COLOR IMAGE DISPLAY DEVICE, METHOD OF DRIVING THE SAME, AND ELECTRONIC EQUIPMENT

(75) Inventor: Munehiro Azami, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 171 days.

(21) Appl. No.: 10/795,240

(22) Filed: Mar. 9, 2004

(65) Prior Publication Data

US 2004/0174448 A1 Sep. 9, 2004

Related U.S. Application Data

(62) Division of application No. 09/771,616, filed on Jan. 30, 2001, now Pat. No. 6,702,407.

(30) Foreign Application Priority Data

Jan. 31, 2000 (JP) ............................. 2000-022536

(51) Int. Cl.
*G09G 5/10* (2006.01)
(52) U.S. Cl. .................. 345/690; 345/204; 345/100
(58) Field of Classification Search ................ 345/77, 345/83, 88, 98–100, 103, 204, 690; 341/144, 341/146
See application file for complete search history.

(56) References Cited

U.S. PATENT DOCUMENTS

| | | | |
|---|---|---|---|
| 5,247,190 A | 9/1993 | Friend et al. | |
| 5,399,502 A | 3/1995 | Friend et al. | |
| 5,643,826 A | 7/1997 | Ohtani et al. | |
| 5,844,538 A | 12/1998 | Shiraki et al. | |
| 5,923,962 A | 7/1999 | Ohtani et al. | |
| 6,184,855 B1 | 2/2001 | Kobayashi et al. | |
| 6,219,022 B1 | 4/2001 | Yamazaki et al. | |
| 6,268,841 B1 | 7/2001 | Cairns et al. | |
| 6,281,868 B1 | 8/2001 | Takeuchi et al. | |
| 6,380,920 B1 * | 4/2002 | Ozawa | ....................... 345/100 |
| 6,456,271 B1 | 9/2002 | Tamai et al. | |
| 6,597,349 B1 | 7/2003 | Koyama et al. | |

(Continued)

FOREIGN PATENT DOCUMENTS

EP 0 938 074 8/1999

(Continued)

OTHER PUBLICATIONS

Hermann Schenk et al., "Polymers for Light Emitting Diodes," Euro-Display '99 Proceedings, pp. 33-37.

*Primary Examiner*—Ricardo Osorio
(74) *Attorney, Agent, or Firm*—Eric J. Robinson; Robinson Intellectual Property Law Office, P.C.

(57) ABSTRACT

A gray-scale power supply line supplied to a source signal line driving circuit is made only one system, and each of D/A conversion circuits drives source signal lines in which three source signal lines corresponding to RGB are made a unit and the number of which is a multiple of 3. The periods in which respective source line selecting circuits select source signal lines corresponding to respective colors of the RGB are made synchronous with each other, and the power supply voltage applied to the gray-scale power supply line is changed in one horizontal writing period, so that power supply voltages corresponding to R, G and B are respectively applied to the gray-scale power supply line in periods while the source signal lines of R, G and B are respectively selected.

18 Claims, 33 Drawing Sheets

U.S. PATENT DOCUMENTS

| | | | |
|---|---|---|---|
| 6,702,407 B1 * | 3/2004 | Azami | 305/204 |
| 6,774,833 B1 * | 8/2004 | Tanaka | 341/144 |
| 2002/0145602 A1 * | 10/2002 | Matsueda | 345/213 |

FOREIGN PATENT DOCUMENTS

| | | |
|---|---|---|
| JP | 07-130652 | 5/1995 |
| JP | 08-078329 | 3/1996 |
| JP | 10-092576 | 4/1998 |
| JP | 10-135468 | 5/1998 |
| JP | 10-135469 | 5/1998 |
| JP | 11-167373 | 6/1999 |
| WO | WO 90/13138 | 11/1990 |

* cited by examiner

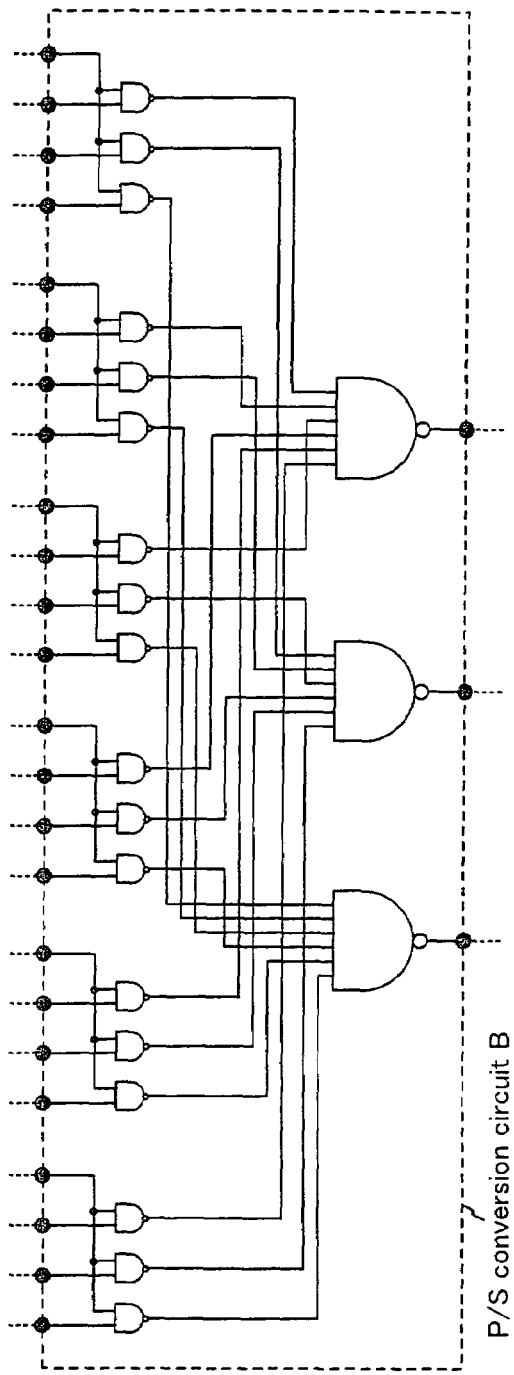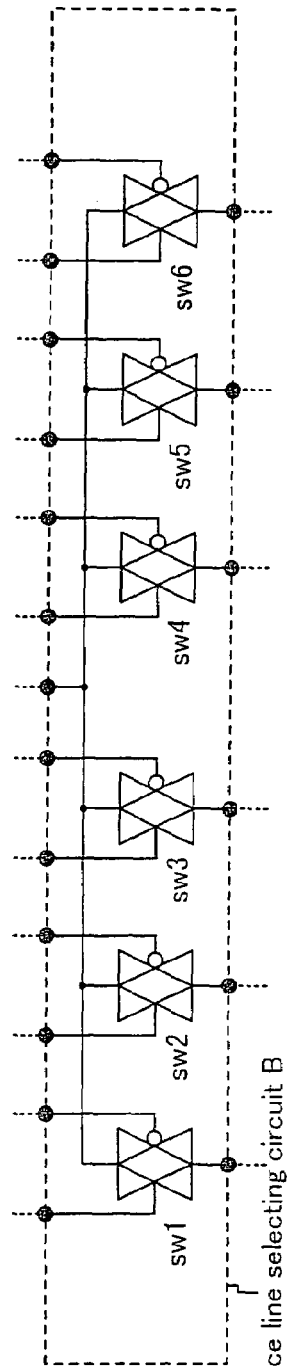
Fig.9A
Fig.9B

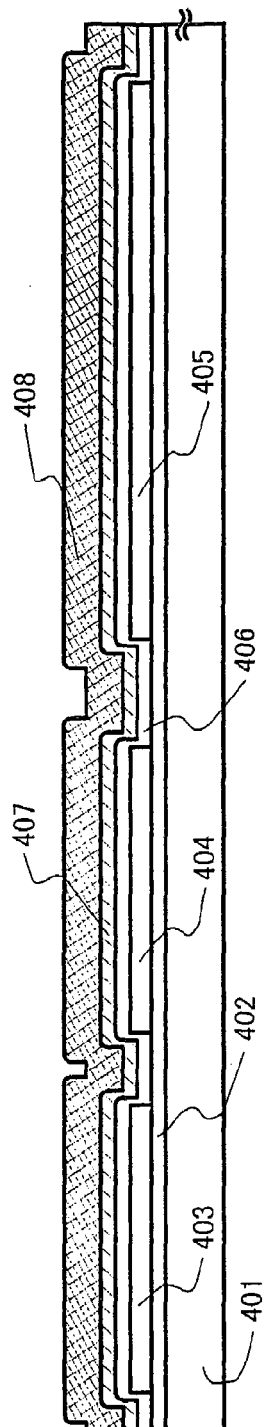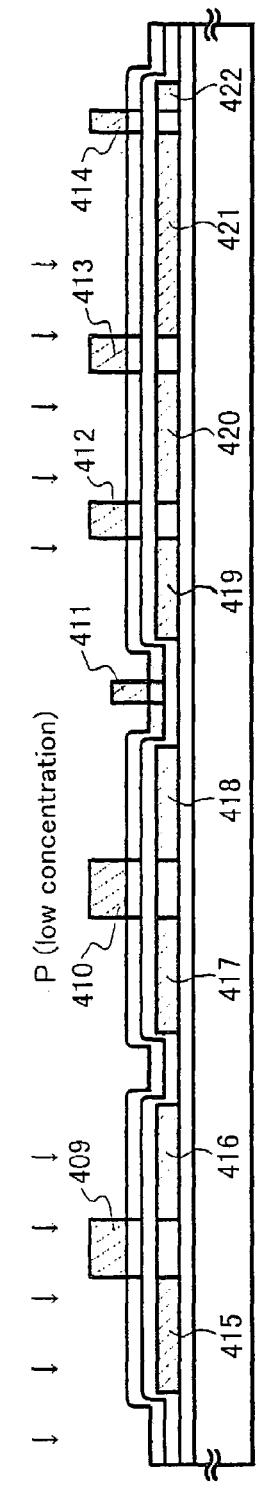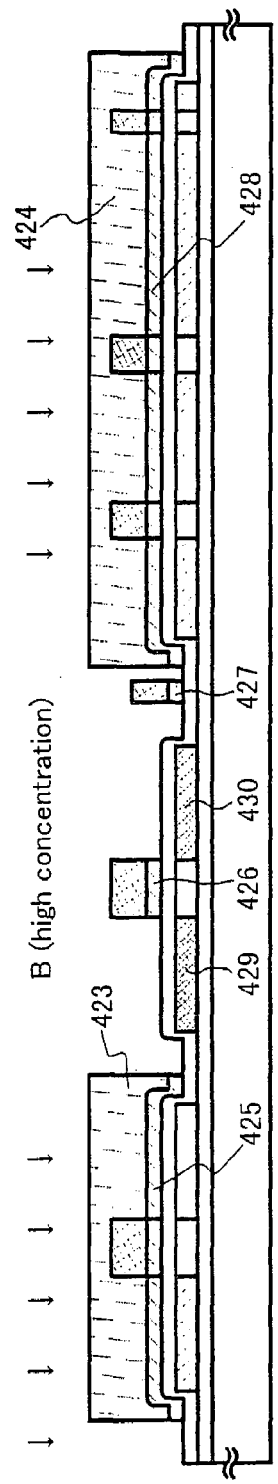

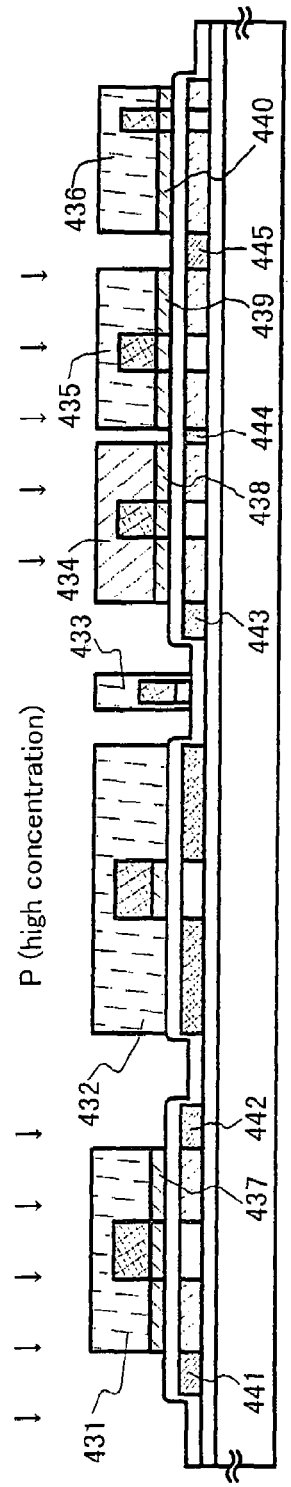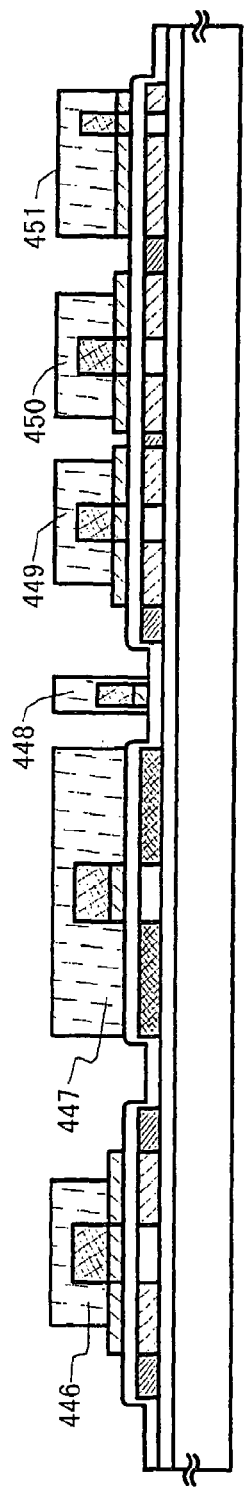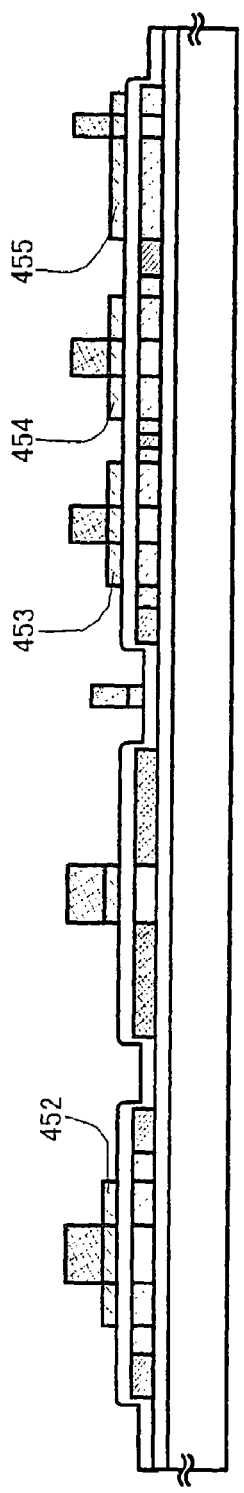

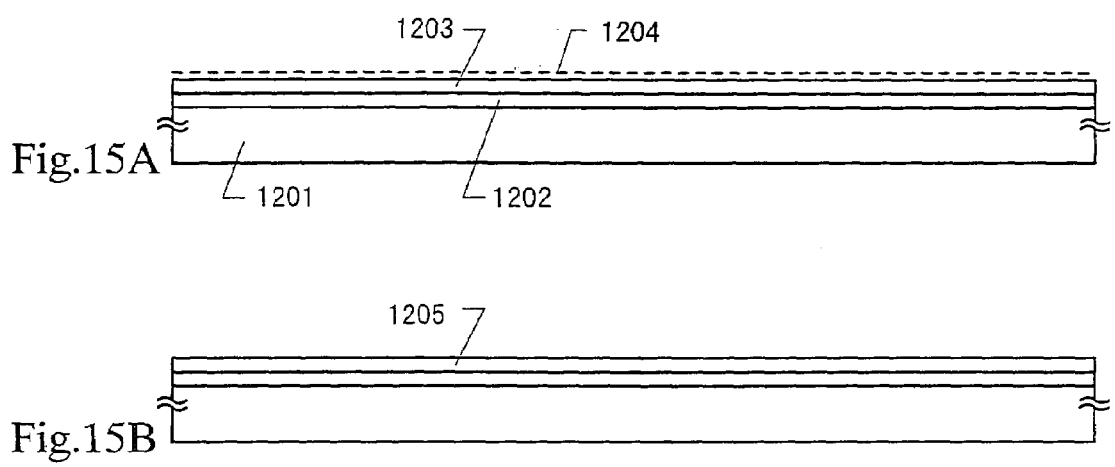

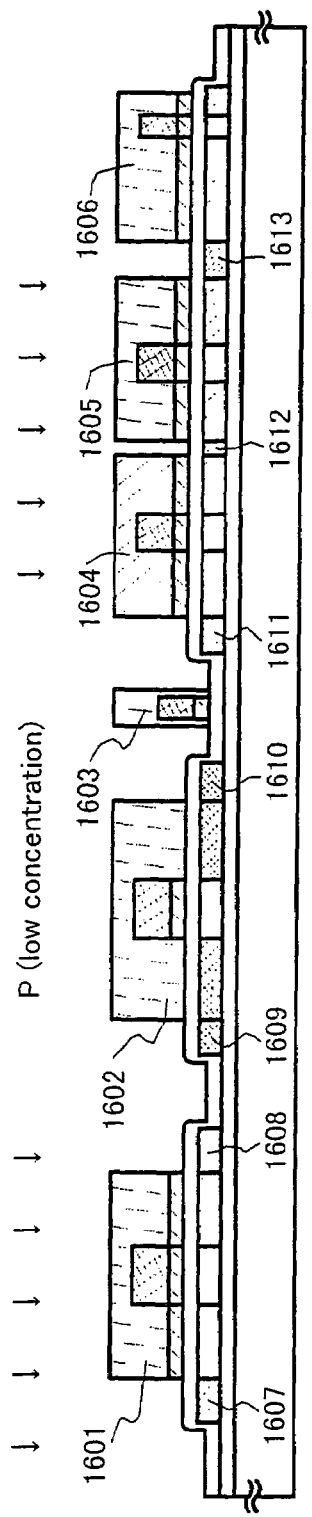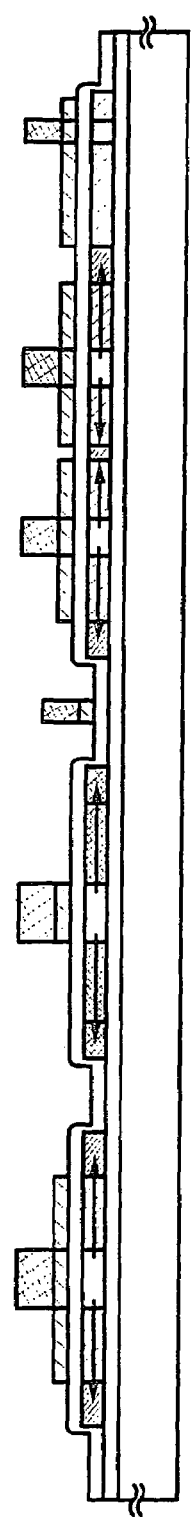
Fig.19A
Fig.19B

COLOR IMAGE DISPLAY DEVICE, METHOD OF DRIVING THE SAME, AND ELECTRONIC EQUIPMENT

This application is a divisional of U.S. application No. 09/771,616, filed on Jan. 30, 2001, now issued as U.S. Pat. No. 6,702,407.

BACKGROUND OF THE INVENTION

1. Field of the Invention

The present invention relates to a color image display device (active matrix color image display device) in which information such as a picture image is displayed by switching elements and pixels arranged in a matrix form, particularly to a digital system driving method and an image display device using the same, and to an electronic equipment.

2. Description of the Related Art

In recent years, a technique of fabricating a semiconductor device including a semiconductor thin film formed on an inexpensive glass substrate, for example, a thin film transistor (TFT), has been rapidly developed. The reason is that the demand for an active matrix image display device has increased.

The active matrix image display device includes an active matrix liquid crystal image display device using liquid crystal for a display element, an EL display device using an electro luminescence (EL) element, and the like. Hereinafter, as a typical example of the active matrix image display device, the active matrix liquid crystal display device will be described.

As shown in FIG. 30, the active matrix liquid crystal display device includes a source signal line driving circuit 101, a gate signal line driving circuit 102, and a pixel array portion 103 disposed in a matrix form. The source signal line driving circuit 101 samples an inputted picture signal in synchronization with a timing signal such as a clock signal and writes the data into respective source signal lines 104. The gate signal line driving circuit 102 sequentially selects gate signal lines 105 in synchronization with a timing signal such as a clock signal and controls the on and off of a TFT (pixel TFT) 106 as a switching element in each of pixels of the pixel array portion 103. By this, data written in the respective source signal lines 104 are sequentially written in the respective pixels.

Although a driving system of the source signal line driving circuit includes an analog system and a digital system, attention has been paid to the digital system active matrix liquid crystal display device in which high definition and high speed driving can be achieved.

A conventional digital system source signal line driving circuit is shown in FIG. 31. In FIG. 31, reference numeral 201 designates a shift register portion which is constituted by a shift register basic circuit 202 including flipflop circuits and the like. When a start pulse SP is inputted to the shift register portion 201, sampling pulses are sequentially transmitted to first latch circuits 203 (LAT 1) in synchronization with a clock signal CLK.

In synchronization with the sampling pulses from the shift register portion, the first latch circuits 203 (LAT 1) sequentially store n-bit (n is a natural number) digital picture signals supplied from data bus lines (DATA-R, DATA-G, DATA-B).

After signals for one horizontal pixels are written in the LAT 1 portion, the digital picture signals held in the respective first latch circuits 203 (LAT 1) are transferred all together to second latch circuits 204 (LAT 2) in synchronization with a latch pulse supplied from a latch signal bus line (LP).

When the digital picture signals are held in the second latch circuits 204 (LAT 2), the start pulse (SP) is again inputted, and digital picture signals for pixels of a next line are newly written in the LAT 1 portion. In the meantime, the digital picture signals for the pixels of the former line are stored in the LAT 2 portion, and analog picture signals corresponding to the digital picture signals are written in respective source signal lines by digital/analog signal conversion circuits (hereinafter referred to as D/A conversion circuits) 205 (D/A). In FIG. 31, reference characters Vref-R, Vref-G and Vref-B respectively designate gray-scale power supply lines connected to the D/A conversion circuits 205 corresponding to respective colors of R (red), G (green) and B (blue). Reference characters SL1, SL2, . . . designate numbered source signal lines, R, G, B written below SL1 and the like designate red, green and blue, respectively, and it is assumed that the display device can produce a color display with a single plate.

Each of the respective D/A conversion circuits 205 shown in FIG. 31 is connected to one source signal line, and the analog picture signal is written in the one source signal line. However, in the case where a liquid crystal display device of high resolution and high definition is fabricated, forming the same number of D/A conversion circuits, each occupying a large area, as the source signal lines is an obstacle to the miniaturization of the liquid crystal display device which is desired in recent years, and a method of driving a plurality of source signal lines by one D/A conversion circuit is proposed in Japanese Patent Application Laid-open No. Hei. 11-167373.

FIG. 32 shows a structural example of a source signal line driving circuit for driving four source signal lines by one D/A conversion circuit. As is understood from comparison with FIG. 31, a parallel/serial conversion circuit 301 (P/S conversion circuit), a source signal line selecting circuit 302, and a selecting signal (SS) inputted to those are newly added in FIG. 32. In spite of the fact that such circuits are added, if writing of signals in four source signal lines can be made by one D/A conversion circuit, the effect that the number of necessary D/A conversion circuits can be made ¼ of the original number is great, and it becomes possible to decrease the occupied area of the source signal line driving circuit.

In FIG. 31, the gray-scale power supply lines of three independent systems for RGB are supplied to the source signal line driving circuits. However, differently from FIG. 31, a gray-scale power supply line of only one system is supplied to the source signal line driving circuit shown in FIG. 32. In general, when a power supply voltage of the gray-scale power supply line is given, the output voltage range of the D/A conversion circuit is uniquely determined. Thus, in the source signal line driving circuit of FIG. 32 to which the gray-scale power supply line of one system is supplied, the ranges of voltages written in the respective source signal lines become same and irrespective for RGB.

The dependency of a luminance ratio of a liquid crystal display device on a voltage applied to a liquid crystal is not quite the same for the respect colors of RGB, and it is different according to the colors as an example shown in FIG. 33. In this example, a voltage value where the luminance ratio has the minimum value is VR, (<) VG, (<) VB for the respective colors of RGB and is different from one another. Thus, when a voltage is applied to a liquid crystal, in order to prevent the monotonicity of gray-scale display from being lost, the maximum voltage which can be applied to the liquid crystal become VR, VG or VB for the respective colors of RGB. However, in the case where a gray-scale power supply line of only one system is supplied as shown in FIG. 32, the range of voltage which can be applied to the liquid crystal becomes uniform and irrespective for RGB as described above, so that the maximum voltage which can be applied becomes VR for the liquid crystal having the luminance ratio—voltage characteristics of FIG. 33. At this time, there occur problems that G and B do not become sufficiently dark states, and the contrast becomes low, and further, an expression property for accurate color becomes poor.

From the above reason, as shown in FIG. 31, it is desirable to enable an applied voltage to the liquid crystal to be controlled independently for RGB by such a method as to provide gray-scale power supply lines of three systems independently for RGB.

However, in the case where a plurality of source signal lines are driven by one D/A conversion circuit in the method of providing gray-scale power supply lines of three systems, the number of the gray-scale power supply lines is increased, and a switch for switching connection between one of those gray-scale power supply lines and the D/A conversion circuit becomes necessary. These cause new problems such as an increase in the number of external input pins, and an increase in the occupied area of the driving circuit by a region for wiring of the gray-scale power supply lines, the added switch, and the like. Under such circumstance, the merit of driving a plurality of source signal lines by one D/A conversion circuit and decreasing the occupied area of the driving circuit is lost.

SUMMARY OF THE INVENTION

An object of the present invention is therefore to provide a driving method which can solve these problems.

According to the present invention, a gray-scale power supply line supplied to a source signal line driving circuit is made only one system, and each of D/A conversion circuits writes analog picture signals into source signal lines in which three source signal lines corresponding to RGB is made a unit and the number of which is a multiple of 3. A power supply voltage of the gray-scale power supply line is changed in one horizontal writing period. The periods in which respective source signal line selecting circuits select source signal lines corresponding to respective colors of RGB are made synchronous, so that the power supply voltage applied to the gray-scale power supply line is such that the power supply voltage corresponding to R is applied in a period when the source signal line of R is selected, the power supply voltage corresponding to G is applied in a period when the source signal line of G is selected, and the power supply voltage corresponding to B is applied in a period when the source signal line of B is selected.

Accordingly, it becomes possible to control the voltage of a pixel electrode independently for RGB without causing an increase in the number of external input pins and an increase in the occupied area of a driving circuit.

BRIEF DESCRIPTION OF THE DRAWINGS

In the accompanying drawings:

FIGS. 9A and 9B are circuit diagrams of a P/S conversion circuit and a source line selecting circuit in the embodiment 2;

FIGS. 11A to 11C are sectional views showing fabricating steps of a TFT;

FIGS. 12A to 12C are sectional views showing fabricating steps of the TFT;

FIGS. 15A and 15B are views showing fabricating steps of a crystalline silicon film;

FIGS. 19A and 19B are views showing fabricating steps of a TFT.

DETAILED DESCRIPTION OF THE INVENTION

Embodiment Mode

The embodiment mode of the present invention will now be described with reference to the drawings.

In this mode, a description will be made on a method in which a gray-scale power supply line of one system is supplied to a source signal line driving circuit, and each of D/A conversion circuits drives three source signal lines respectively corresponding to RGB.

Besides, in this mode, a description will be made on, as an example, a case where each color of RGB corresponds to (n+1)-bit (n is a natural number) digital picture signal input.

Figure 1:
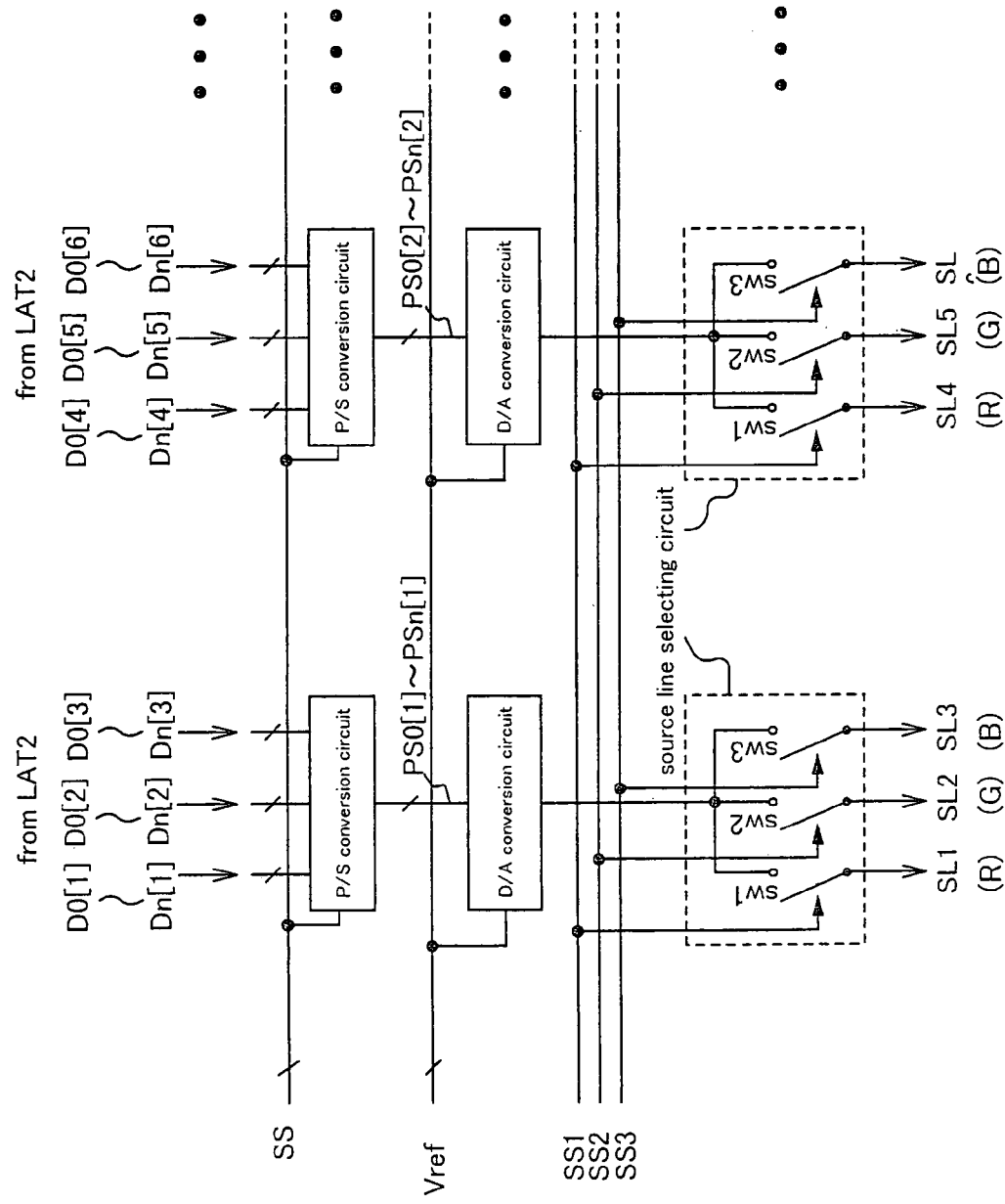
FIG. 1 is a schematic view of a driving circuit according to the embodiment mode of the present invention.

FIG. 1 is a schematic circuit diagram of this mode. FIG. 1 does not show a shift register portion for generating sampling pulses for sequentially sampling digital picture signals, a first latch circuit portion for latching the digital picture signals in accordance with the sampling pulses, and a second latch circuit portion for latching the digital picture signals stored in the first latch circuit portion all at once, which are omitted. A parallel/serial conversion circuit (P/S conversion circuit) collects parallel output data (D0[3k+1] to Dn[3k+1], D0[3k+2] to Dn[3k+2], D0[3k+3] to Dn[3k+3](k is an integer larger than and equal to 0) of second latch circuits for every bit signal and converts them into serial data. Here, D0[3k+1] designates a digital picture signal of the least (first) bit (LSB) to a (3k+1)-th source signal line, and also Dn[3k+1] designates the most ((n+1)-th) bit (MSB) to the (3k+1)-th source signal line. In the following, Dl[s] designates a digital picture signal of a (l+1)-th bit to an s-th source signal line. Besides, the (3k+1)-th source signal line is a source signal line for displaying R, the (3k+2)-th source signal line is a source signal line for displaying G, and the (3k+3)-th source signal line is a source signal line for displaying B.

A source line selecting circuit is constituted by three switches sw1, sw2 and sw3. When the switch sw1 is switched on, the (3k+1)-th source signal line (source signal line in charge of R) is connected to output of a D/A conversion circuit, when the switch sw2 is switch on, the (3k+2)-th source signal line (source signal line in charge of G) is connected to output of the D/A conversion circuit, and when the switch sw3 is switched on, the (3k+3)-th source signal line (source signal line in charge of B) is connected to output of the D/A conversion circuit. Reference characters SS1 to SS3 designate selecting signals for controlling the on and off of the switches sw1 to sw3, respectively.

Figure 2:
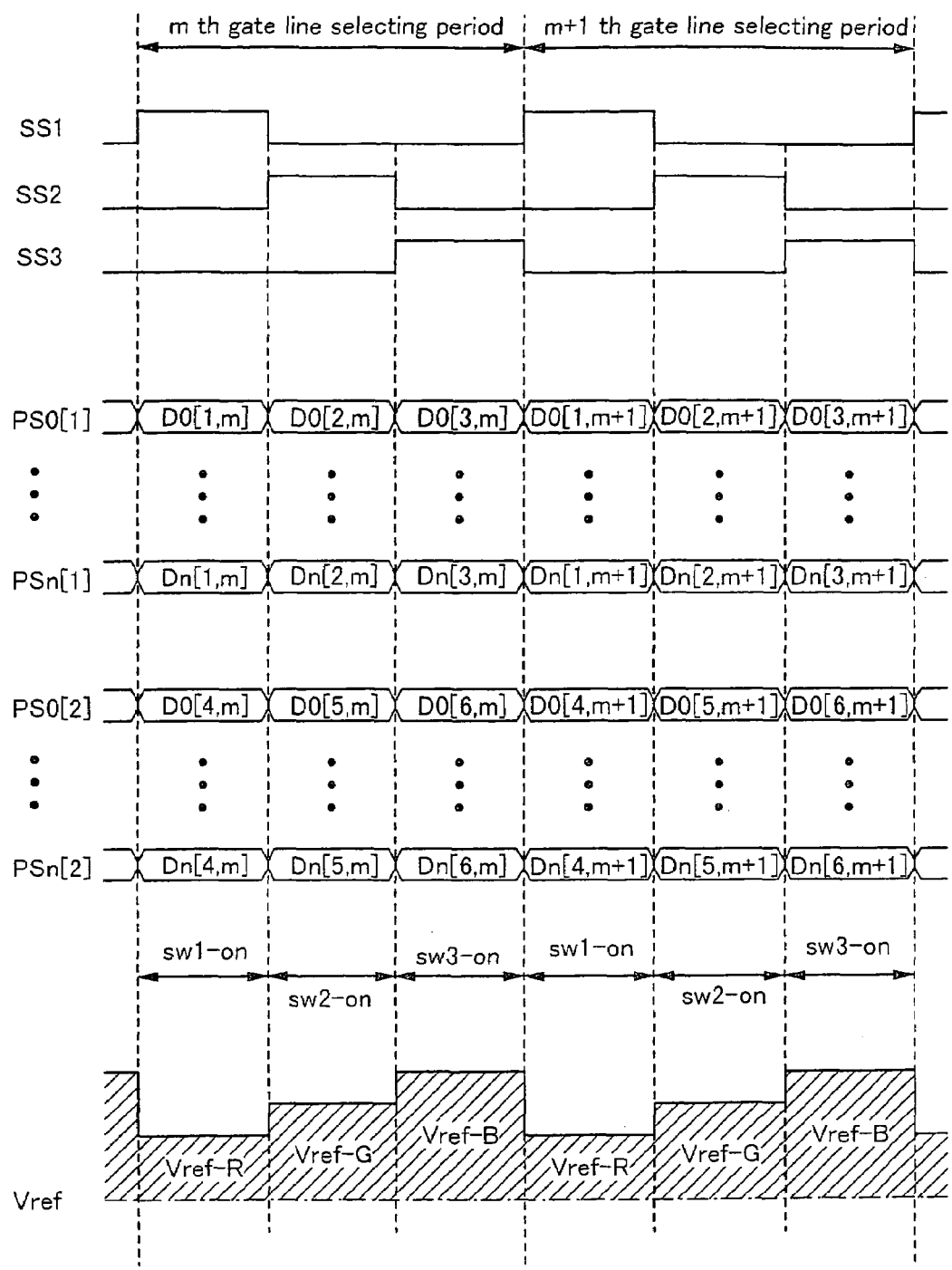
FIG. 2 is a view showing an example of operation timing of the embodiment mode of FIG. 1.

FIG. 2 shows signal operation timing to the driving circuit of FIG. 1. The drawing shows such operation that one gate line selecting period is divided into three periods, the selecting signal SS1 is made to have a Hi level in the first period to switch on the switch sw1, the selecting signal SS2 is made to have the Hi level in the second period to switch on the switch sw2, and the selecting signal SS3 is made to have the Hi level in the third period to switch on the switch sw3. Note that the output signals (PS0[k] to PSn[k]) of the respective P/S conversion circuits are made to synchronize with the selecting signals (SS1 to SS3), and are controlled by the selecting signal SS inputted to the P/S conversion circuits so that the digital picture signal corresponding to the (3k+1)-th source signal line is outputted in the first period of the three divisions of the one gate line selecting period, the digital picture signal corresponding to the (3k+2)-th source signal line is outputted in the second period thereof, and the digital picture signal corresponding to the (3k+3)-th source signal line is outputted in the third period thereof. Accordingly, the digital picture signals corresponding to the respective source signal lines are reflected in writing of the suitable source signal lines. This state is shown by PS0[1] to PSn[1], PS0[2] to PSn[2] of FIG. 2. Here, PSl[k] designates an output signal of the (l+1)-th bit of the k-th stage P/S conversion circuit. Thus, PSl[k] is constituted by digital picture signals of Dl[3k−2], Dl[3k−1], and Dl[3k]. Besides, in FIG. 2, Dl[s, g] designates a digital picture signal of the (l+1)-th bit to a pixel at an s-th column and a g-th row, and information of the gate signal line is newly added to the denotation Dl[s].

Next, a method of inputting a power supply voltage to a gray-scale power supply line Vref is shown by Vref of FIG. 2. In the drawing, Vref-R, Vref-G, and Vref-B indicate application of power supply voltages of the gray-scale power supply line corresponding to the respective colors of R, G and B. In the first period of the three divisions of one gate line selecting period, since the (3k+1)-th source signal line (source signal line in charge of R) is selected by the source line selecting circuit, the power supply voltage for displaying R is applied to the gray-scale power supply line. Similarly, in the second and third periods of the three divisions of the one gate line selecting period, the power supply voltages for displaying G and B are respectively applied to the gray-scale power supply line.

According to this mode, in the form of driving three source signal lines of RGB by one D/A conversion circuit, even in the case where the gray-scale power supply line of only one system is supplied to the source signal line driving circuit, it becomes possible to control the voltages of pixel electrodes independently for RGB. In this mode, although the example in which one D/A conversion circuit drives three source signal lines has been described, the present invention is not limited to this, but can be applied to a case where one D/A conversion circuit drives source signal lines the number of which is a multiple of three, such as three, six, . . . . The sequence in which the source line selecting circuit selects the source signal lines is not limited to the sequence of R, G and B as in this mode, but another sequence may be adopted. Further, in this mode, although the parallel/serial conversion circuit (P/S conversion circuit) is used, the present invention is not limited to the existence of this. That is, the present invention can be applied to any method of serially inputting digital picture signals for a plurality of source signal lines to a D/A conversion circuit in one gate line selecting period.

Next, preferred embodiments of the present invention will be described with reference to the drawings. However, the present invention is not limited to the following embodiments.

Embodiment 1

Figure 3:
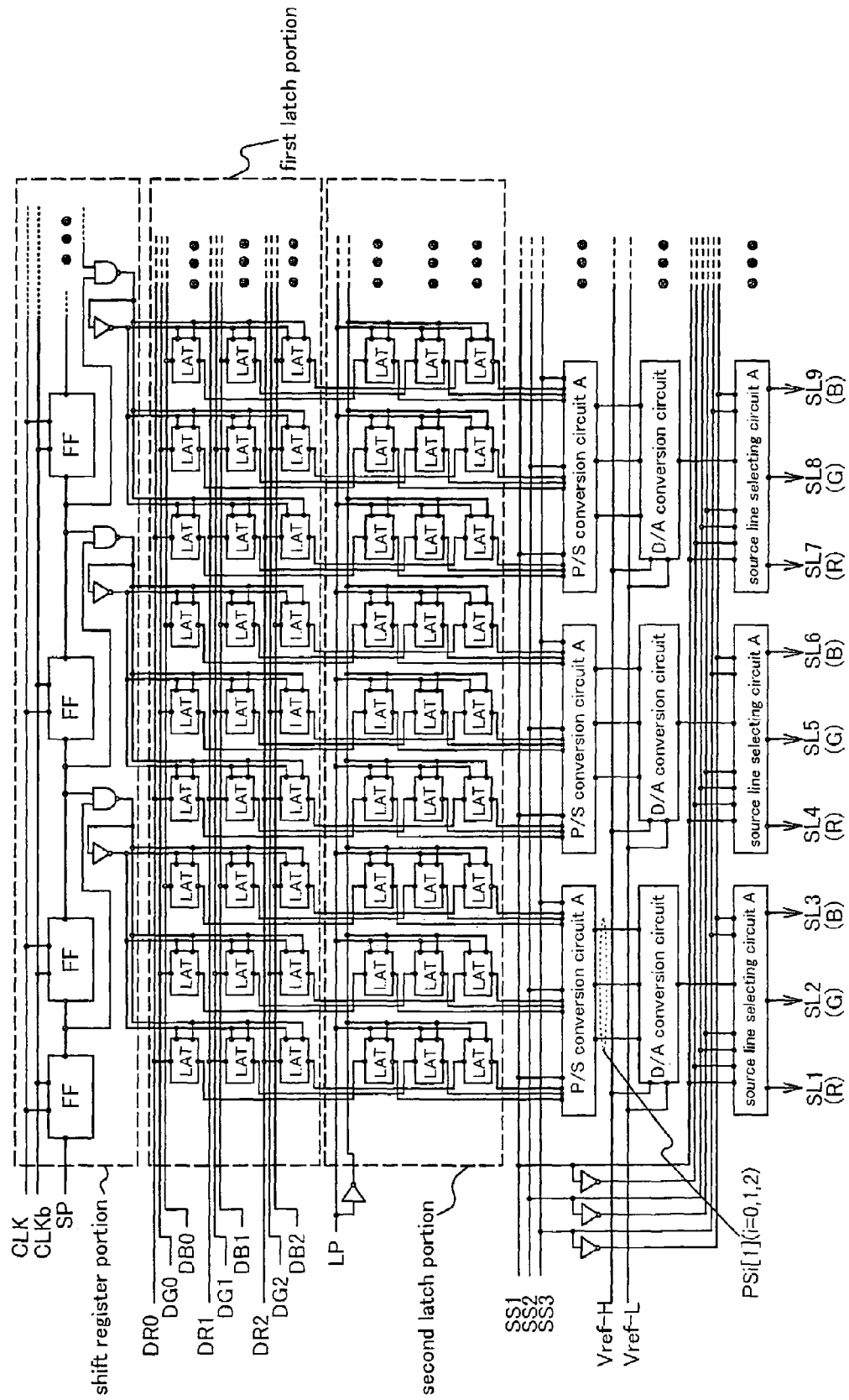
FIG. 3 is a view of a source signal line driving circuit in embodiment 1.

In this embodiment, an example in which the present invention is applied to an active matrix image display device will be described. As described in the related art, the active matrix image display device includes a source signal line driving circuit, a gate signal line driving circuit, and a pixel array portion disposed in a matrix form. Since the operations of the gate signal line driving circuit and the pixel array portion are the same as the related art, in this embodiment, the source signal line driving circuit will be described. Besides, as shown in FIG. 3, in this embodiment, a description will be made on a case, as an example, where a digital picture signal to the respective colors of RGB has 3 bits, and one D/A conversion circuit drives three source signal lines.

Figure 4A:
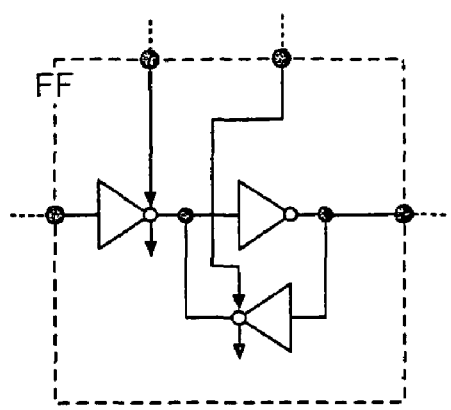
FIGS. 4A and 4B are circuit diagrams of a flipflop circuit (FF) and a basic latch circuit (LAT) in the embodiment 1.

A shift register portion includes flipflop circuits (FF), NAND circuits, and inverter circuits, and a clock signal (CLK), an inversion clock signal (CLKb) of the clock signal, and a start pulse (SP) are inputted thereto. As shown in FIG. 4A, the flipflop circuit is constituted by a clocked inverter circuit and an inverter circuit.

When the start pulse (SP) is inputted, a sampling pulse is sequentially shifted in synchronization with the clock signals (CLK, CLKb).

Figure 4B:
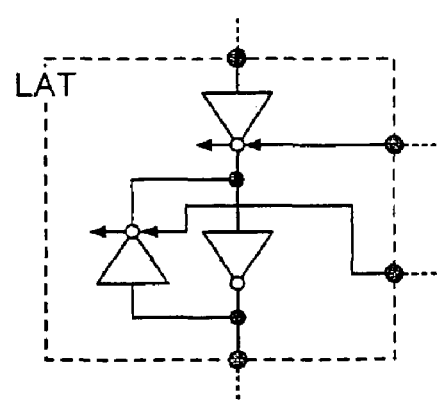

A first latch portion and a second latch portion as storage circuits are constituted by basic latch circuits (LAT). The basic latch circuit is shown in FIG. 4B. The basic latch circuit (LAT) is constituted by a clocked inverter circuit and an inverter circuit. Digital picture signals (DR0, DR1, DR2, DG0, DG1, DG2, DB0, DB1, DB2) of R, G and B each having three bits are inputted to the first latch portion, and the digital picture signals are latched by the sampling pulse from the shift register portion. The second latch portion latches the digital picture signals held in the first latch portion all at once in accordance with a latch pulse (LP) inputted in a horizontal retrace period, and at the same time, transmits information to a downstream circuit. At this time, the data is held in the second latch portion for one horizontal writing period.

Note that in FIGS. 4A and 4B, although connection of a clock input terminal to a P-channel transistor of each of the clocked inverter circuits is omitted, actually, an inversion signal of a control signal inputted to a clock input terminal to an N-channel transistor is inputted. Besides, in this embodiment, although the flipflop circuit (FF) and the basic latch circuit (LAT) have the same circuit structure, they may have different circuit structures.

Figure 5A:
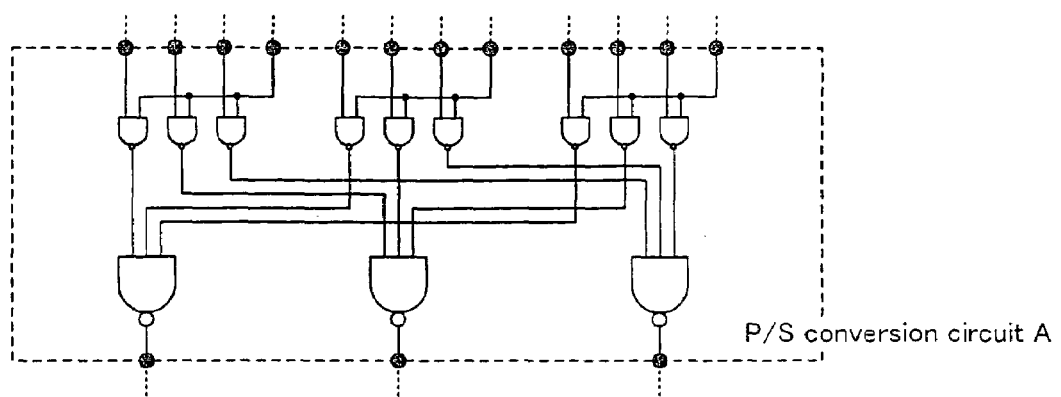
FIGS. 5A and 5B are circuit diagrams of a P/S conversion circuit and a source line selecting circuit in the embodiment 1.

Three (number of bits)×three (for three source signal lines of RGB) digital picture signals stored in the second latch portion and selecting signals (SS1 to SS3) are inputted to a parallel/serial conversion circuit (referred to as a P/S conversion circuit A in FIG. 3). As shown in FIG. 5A, the P/S conversion circuit is constituted by NAND circuits.

Figure 7:
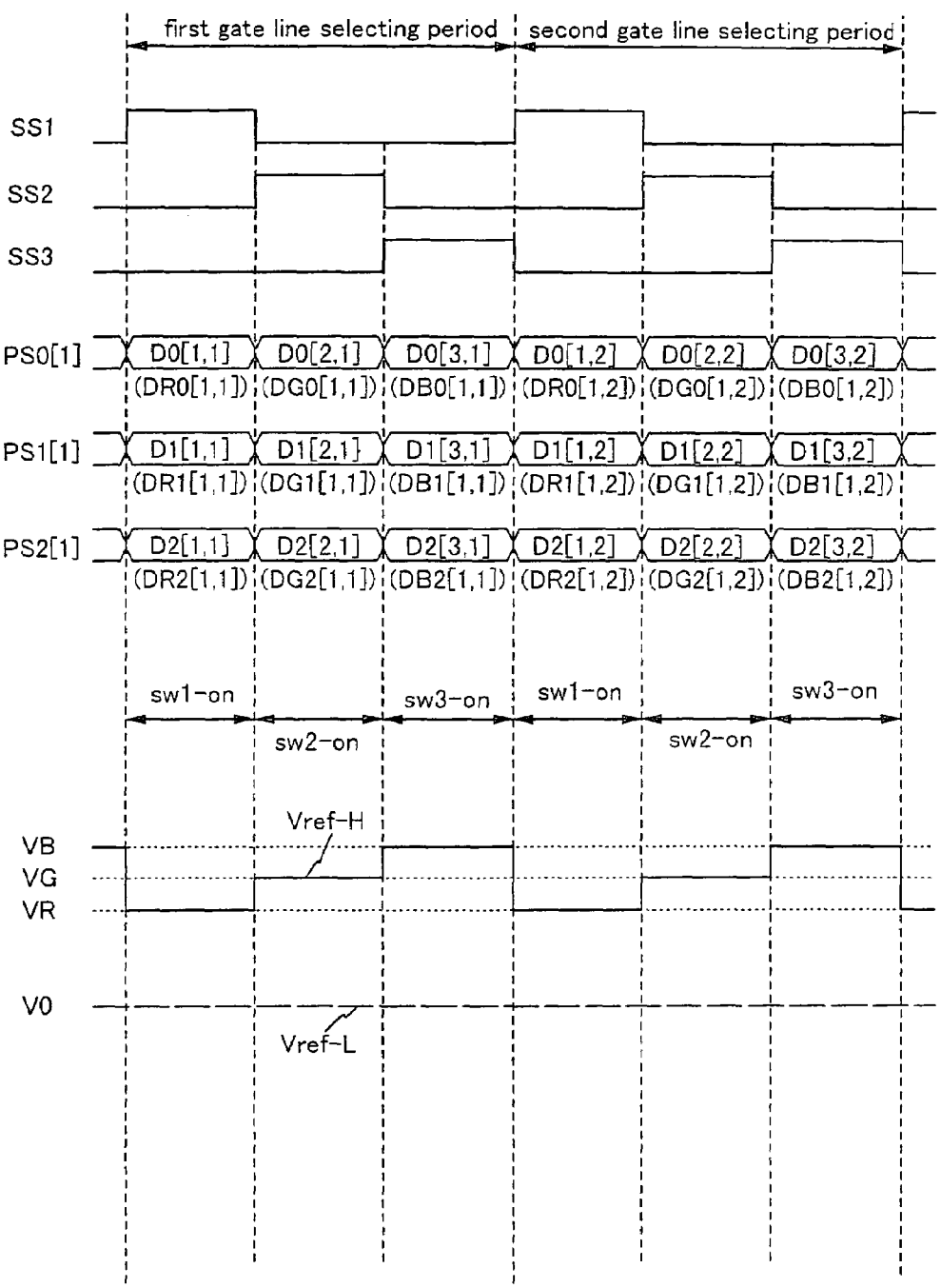
FIG. 7 is a view showing signal operation timing in the embodiment 1.

FIG. 7 shows signal operation timing in which attention is paid to the P/S conversion circuit A concerning first to third source signal lines (SL1 to SL3). One gate line selecting period is divided into three periods, the selecting signal (SS1) is made to have the Hi level in the first period, and the digital picture signal to the first source signal line (SL1) is outputted to the D/A conversion circuit. In the second period, the selecting signal (SS2) is made to have the Hi level, and the digital picture signal to the second source signal line (SL2) is outputted to the D/A conversion circuit. In the third period, the selecting signal (SS3) is made to have the Hi level, and the digital picture signal to the third source signal line (SL3) is outputted to the D/A conversion circuit. This state is shown by PS0[1] to PS2[1] in FIG. 7. Here, PSl[1] designates output data of the (l+1)-th bit of the P/S conversion circuit A concerning the first to third source signal lines (SL1 to SL3). Besides, as described above, Dl[s, g] designates a digital picture signal of the (l+1)-th bit to a pixel at an s-th column and a g-th row. Here, DRl, DGl, DBl (l=0 to 2) differentiated by RGB and Dl[s] (l=0 to 2) have the following relation.

DRl[s]=Dl[3s−2] (l=0 to 2)

DGl[s]=Dl[3s−1] (l=0 to 2)

DBl[s]=Dl[3s] (l=0 to 2)

What is obtained by adding information of a gate signal line to the notation such as DRl[s] is designated by DRl[s, g] and so on.

The same operation as the above is also performed in parallel in the P/S conversion circuits A concerning the other source signal lines (SL4 to SL6, SL7 to SL9, . . . ).

Figure 6:
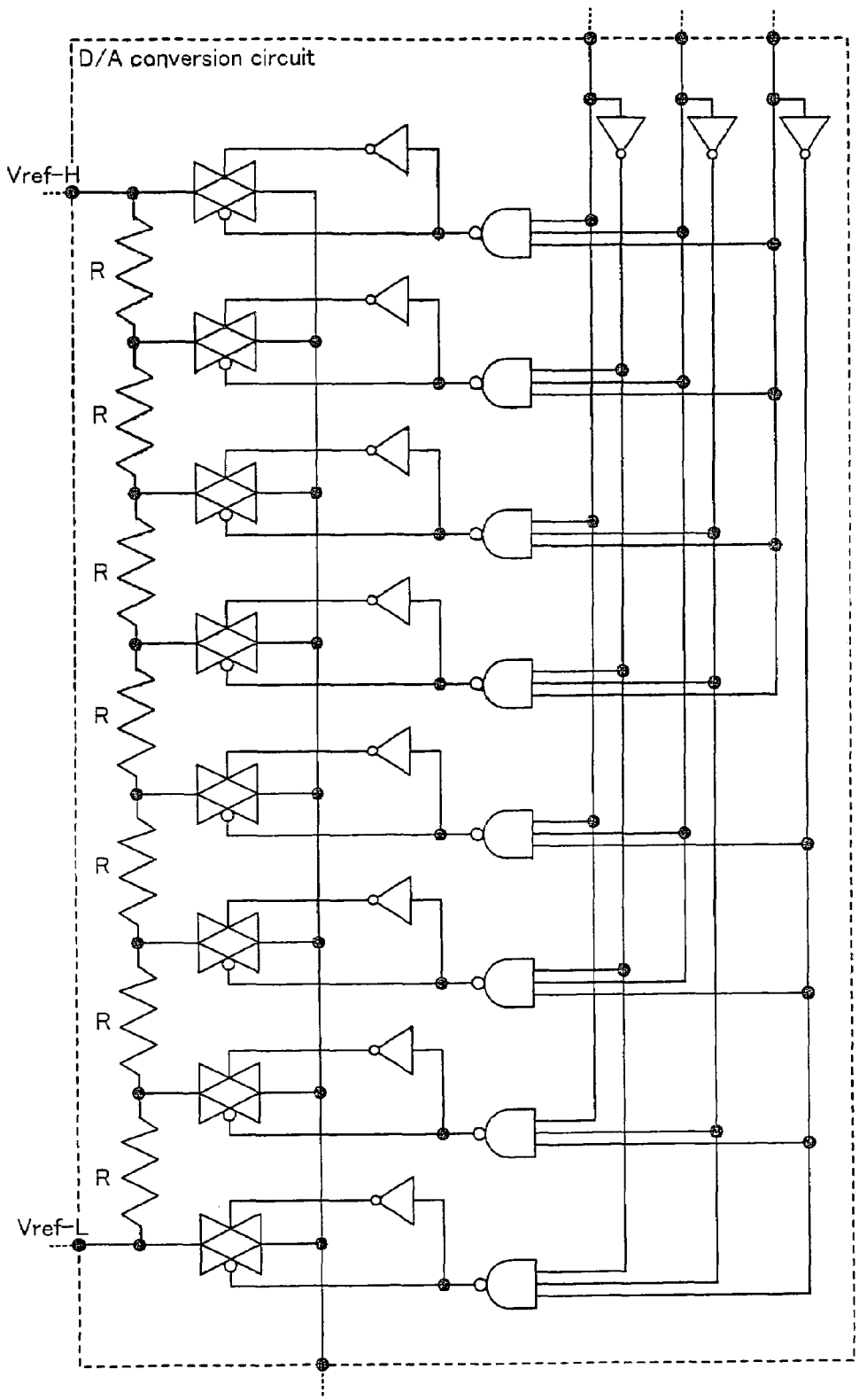
FIG. 6 is a circuit diagram of a D/A conversion circuit in the embodiment 1.

FIG. 6 shows an example of a circuit structure of a D/A conversion circuit. FIG. 6 shows the D/A conversion circuit of a resistor string type, and it is necessary to supply two gray-scale power supply lines in order to obtain an output in a certain voltage range. In FIG. 6, these are designated by Vref-L and Vref-H. The gray-scale power supply voltages of these are divided by resistors, and voltage value corresponding to the digital picture signal of three bits are outputted.

Figure 5B:
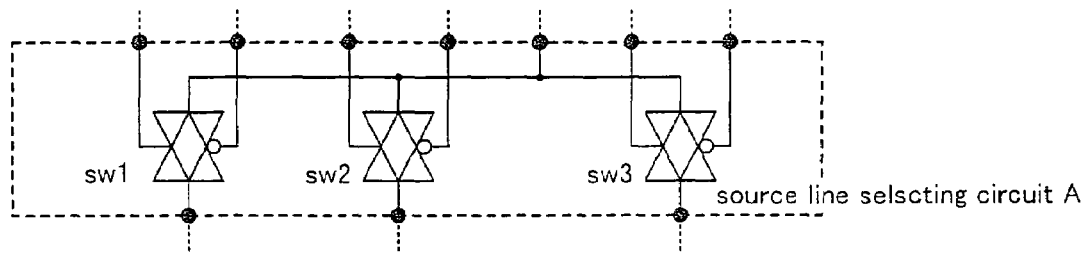

The output of the D/A conversion circuit is connected to a suitable source signal line through the source line selecting circuit A. FIG. 5B shows an example of a circuit structure of the source line selecting circuit A. The source line selecting circuit A is constituted by three transmission gates (switches), and selecting signals (SS1 to SS3) and their inversion signals are inputted to the respective gates. According to the signal operation timing of FIG. 7, in the first period of three divisions of one gate line selecting period, the switch sw1 is switched on and the output of the D/A conversion circuit is written into the first source signal line (SL1) of R. In the second period, the switch sw2 is switched on and the output of the D/A conversion circuit is written into the second source signal line (SL2) of G. In the final third period, the switch sw3 is switched on, and the output of the D/A conversion circuit is written into the third source signal line (SL3) of B.

Such writing is also performed to the other source signal lines in parallel. Then, data written in the respective source signal lines are sequentially written into the respective pixels by the action of the gate signal line driving circuit and the pixel TFTs.

In this embodiment, in the two gray-scale power supply lines Vref-L and Vref-H, Vref-L is made the same voltage for the respective colors of RGB and is made V0, and Vref-H is made VR, VG and VB for RGB. FIG. 7 shows a state where the power supply voltage of the gray-scale power supply line is changed in one gate line selecting period. In the period when the source signal line for R is selected by the source line selecting circuit, the power supply voltage corresponding to R is applied, in the period when the source signal line for G is selected by the source line selecting circuit, the power supply voltage corresponding to G is applied, and in the period when the source signal line for B is selected by the source line selecting circuit, the power supply voltage corresponding to B is applied.

In the case where one D/A conversion circuit drives three source signal lines by the above driving method, even if the gray-scale power supply lines supplied to the source signal line driving circuit is only one system, voltages applied to the pixels can be controlled independently for RGB.

Note that, in this embodiment, although it is assumed that the circuit driving power supply supplied to the source signal line driving circuit is one system, a modification may be made such that two systems or more are adopted and a level shifter circuit is inserted to a necessary portion. Besides, in this embodiment, although the power supply voltages of the gray-scale power supply line Vref-L are made same for RGB, they may be different.

Embodiment 2

Figure 8:
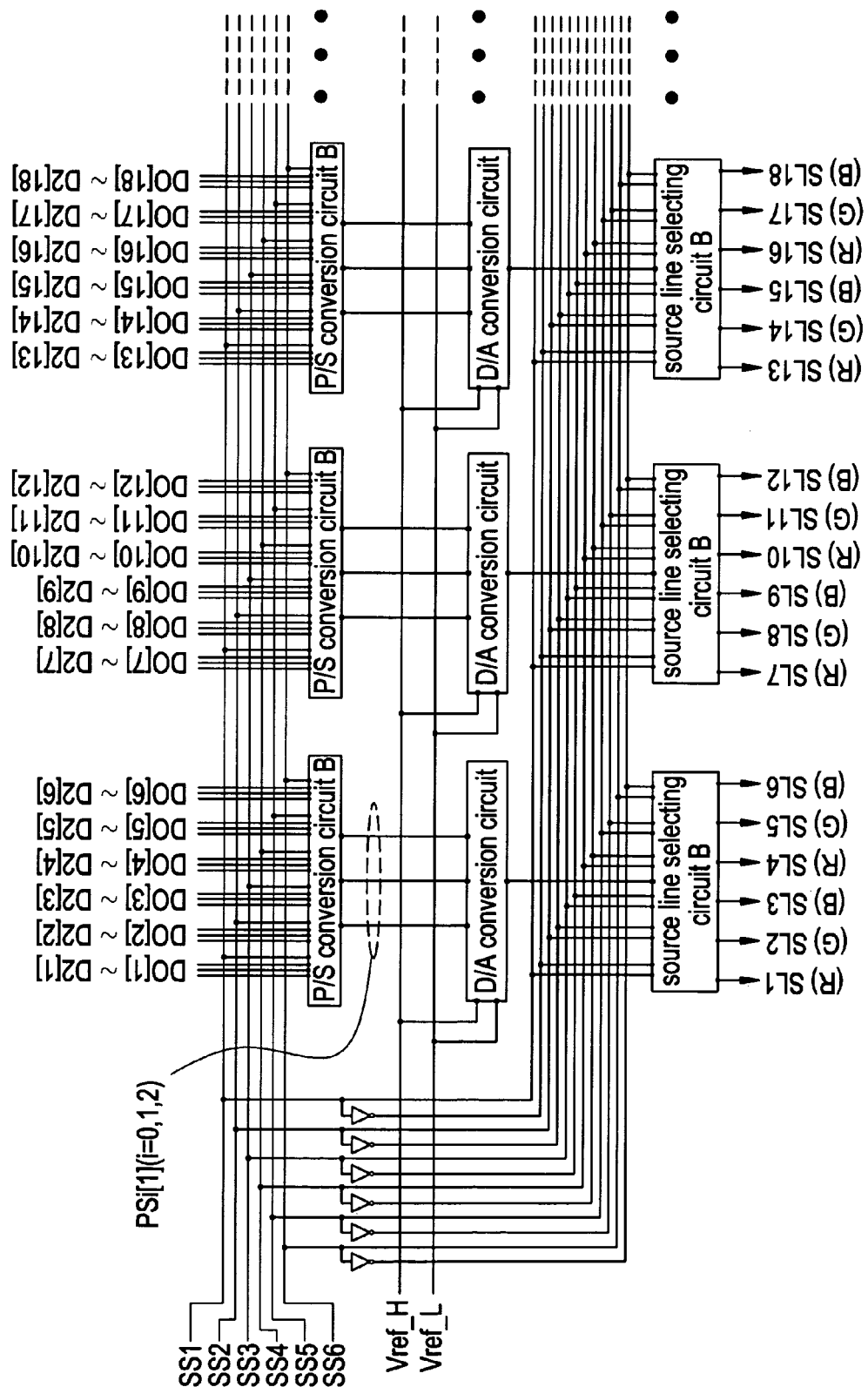
FIG. 8 is a view of a source signal line driving circuit in embodiment 2.

Also in this embodiment, similarly to the embodiment 1, an example in which the present invention is applied to an active matrix image display device will be described. However, differently from the embodiment 1, a description will be made on an example in which one D/A conversion circuit drives six (RGB×2) source signal lines. Also in this embodiment, a source signal line driving circuit will be mainly described. A shift register portion, a first latch portion, and a second latch portion are made the same as the embodiment 1, and their explanations are omitted below. FIG. 8 shows an example of structures of downstream circuits of a second latch circuit in this embodiment. Also in this embodiment, it is assumed that a digital picture signal for the respective colors of RGB has 3 bits.

Three (number of bits)×six (RGB×2, that is, for six source signal lines) digital picture signals stored in the second latch portion and selecting signals (SS1 to SS6) are inputted to a parallel/serial conversion circuit (referred to as a P/S conversion circuit B in FIG. 8). As shown in FIG. 9A, the P/S conversion circuit B is constituted by NAND circuits.

Figure 10:
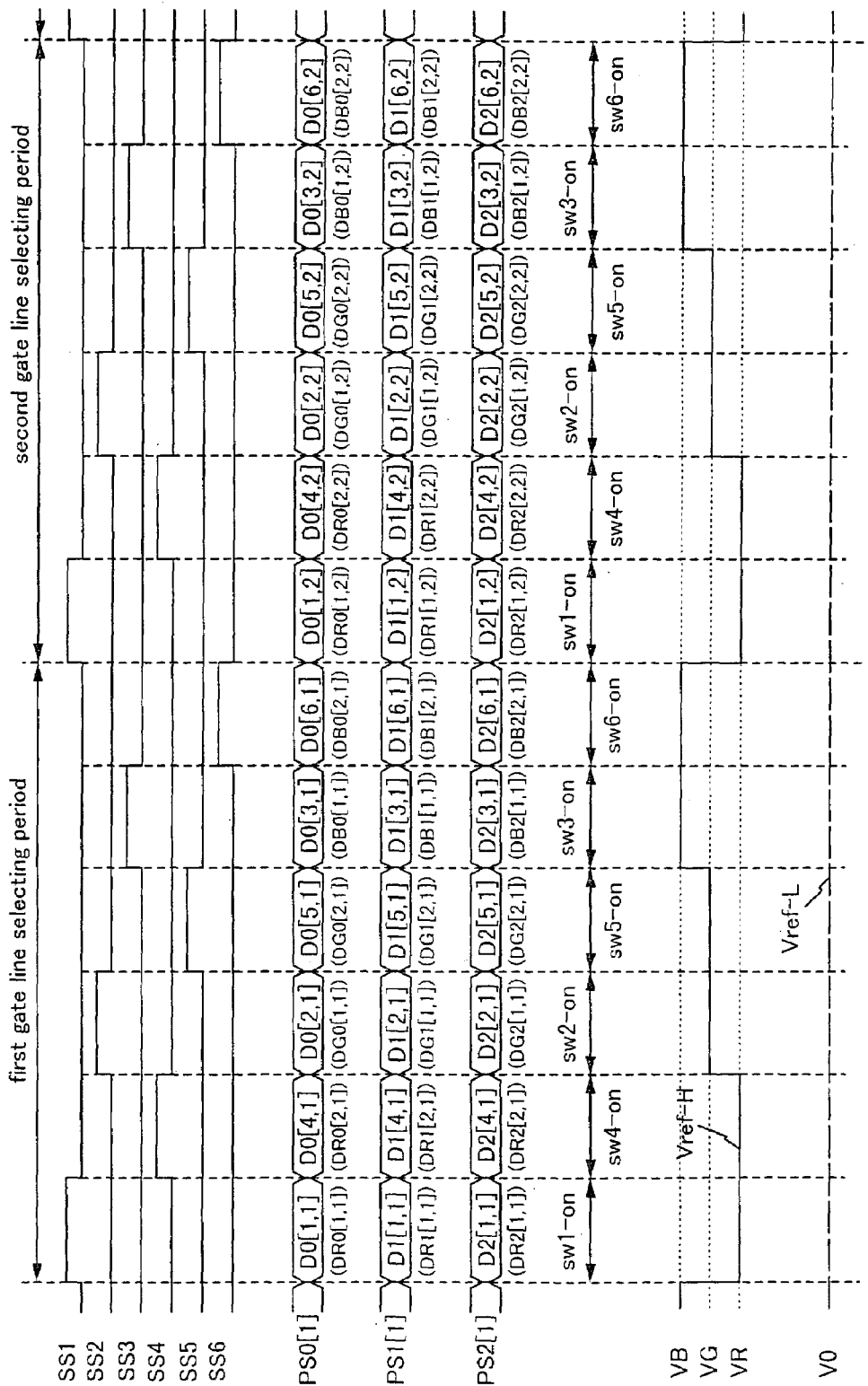
FIG. 10 is a view of showing signal operation timing in the embodiment 2.

FIG. 10 shows signal operation timing in which attention is paid to the P/S conversion circuit B concerning first to sixth source signal lines (SL1 to SL6). For each period of six divisions of one gate line selecting period, six selecting signals SS1, SS4, SS2, SS5, SS3 and SS6 are inputted so as to have the Hi level in this sequence. In this way, the P/S conversion circuit B outputs the digital picture signals corresponding to the source signal lines SL1(R), SL4(R), SL2(G), SL5(G), SL3(B) and SL6(B) in this sequence to the D/A conversion circuit. This state is shown by PS0[1] to PS2[1] of FIG. 10. Here, PSl[1] designates output data of (l+1)-th bit of the P/S conversion circuit B concerning the first to sixth source signal lines (SL1 to SL6). Besides, as described before, Dl[s, g] designates output data of a (l+1)-th bit to a pixel at an s-th column and a g-th row. Here, also in DRl, DGl, DBl (l=0 to 2) differentiated by RGB and Dl[s] (l=0 to 2), the following relation is established.

DRl[s]=Dl[3s−2] (l=0 to 2)
DGl[s]=Dl[3s−1] (l=0 to 2)
DBl[s]=Dl[3s] (l=0 to 2)

What is obtained by adding information of a gate signal line to the notation such as DRl[s] is designated by DRl[s, g] and so on.

The same operation as the above is also performed in parallel in the P/S conversion circuits B concerning the other source signal lines (SL7 to SL12, SL13 to SL18, . . . ).

It is assumed that the D/A conversion circuit is the same as that of the embodiment 1 and is shown in FIG. 6.

The output of the D/A conversion circuit is connected to a suitable source signal line through the source line selecting circuit B. FIG. 9B shows an example of a circuit structure of the source line selecting circuit B. The source line selecting circuit B is constituted by six transmission gates (switches), and the selecting signals (SS1 to SS6) and their conversion signals are inputted to the respective gates. According to the signal operation timing of FIG. 10, in each period of six divisions of one gate line selecting period, six selecting signals SS1, SS4, SS2, SS5, SS3 and SS6 are made to have the Hi level in this sequence. Accordingly, switches in the source line selecting circuit B are switched on in the sequence of sw1, sw4, sw2, sw5, sw3 and sw6, and connect the source signal lines SL1(R), SL4(R), SL2(G), SL5(G)., SL3(B) and SL6(B) in this sequence to the D/A conversion circuit to perform writing into the respective source signal lines.

Such writing is also performed in parallel to the other source signal lines. Then, data written in the respective source signal lines are sequentially written into the respective pixels by the action of the gate signal line driving circuit and pixel TFTs.

Also in this embodiment, in the two gray-scale power supply lines Vref-L and Vref-H, Vref-L is made the same voltage V0 for the respective colors of RGB, and Vref-H is made VR, VG and VB for RGB. FIG. 10 shows a state where the power supply voltages of the gray-scale power supply lines are changed in one gate line selecting period. In the period when the source signal line for R is selected by the source line selecting circuit, the power supply voltage corresponding to R is applied, in the period when the source signal line for G is selected by the source line selecting circuit, the power supply voltage corresponding to G is applied, and in the period when the source signal line for B is selected by the source line selecting circuit, the power supply voltage corresponding to B is applied.

Like this embodiment, in one gate line selecting period, the source signal lines of the same color for RGB are continuously connected to the D/A conversion circuit, so that the period in which the power supply voltage is applied to the gray-scale power supply line can be made longer, and a circuit operation load is lowered.

In the case where one D/A conversion circuit drives six source signal lines by the above driving method, even if the gray-scale power supply lines supplied to the source signal line driving circuit are only one system, voltages applied to the pixels can be controlled independently for RGB.

Note that, in this embodiment, although it is assumed that the circuit driving power supply supplied to the source signal line driving circuit is one system, a modification may be made such that two systems or more are adopted and a level shifter circuit is inserted to a necessary portion. Besides, in this embodiment, although the power supply voltages of the gray-scale power supply line Vref-L for RGB are made same, they may be different from one another. Besides, the sequence of selecting the source signal lines of the source line selecting circuit is not limited to this embodiment.

Embodiment 3

In this embodiment, as an example of a fabricating method in a case where the embodiment 1 and the embodiment 2 are applied to an active matrix liquid crystal display device, a method of fabricating a pixel TFT as a switching element of a pixel portion and a TFT of a driving circuit (source signal line driving circuit, gate signal line driving circuit, etc.) provided at the periphery of the pixel portion on the same substrate will be described in detail in accordance with its steps. However, for simplification of the explanation, a CMOS circuit which is a basic structural circuit in a driving circuit portion is shown, and n-channel TFT is shown in a pixel TFT portion.

In FIG. 11A, an alkali-free glass substrate, for example, a 1737 glass substrate by Corning Inc. is used as a substrate 401. An under film 402 is formed by a plasma CVD method or a sputtering method on a surface of the substrate 401 over which a TFT is to be formed. As the under film 402, a silicon nitride film is formed to a thickness of 25 to 100 nm, here 50 nm, and a silicon oxide film is formed to a thickness of 50 to 300 nm, here 150 nm. As the under film 402, only a silicon nitride film or a silicon nitride oxide film may be used.

Next, an amorphous silicon film having a thickness of 50 nm is formed on the under film 402 by the plasma CVD method. Although depending on the hydrogen content, it is desirable that the amorphous silicon film is heated at 400 to 550° C. for several hours to carry out a dehydrogenating treatment so that the hydrogen content is made 5 atom % or less, and a step of crystallization is carried out. Although the amorphous silicon film may be formed by another fabricating method such as a sputtering method or an evaporation method, it is desirable that an impurity element such as oxygen or nitrogen contained in the film is sufficiently reduced.

Here, both the under film and the amorphous silicon film are formed by the plasma CVD method, the under film and the amorphous silicon film may be continuously formed in vacuum. When a step is contrived such that the under film is not once exposed to the air after it is formed, it becomes possible to prevent contamination of the surface and it is possible to reduce fluctuation in the characteristics of TFTs to be formed.

As a step of crystallizing the amorphous silicon film, a well-known laser crystallizing technique or thermal crystallizing technique may be used. In this embodiment, a pulse oscillation type KrF excimer laser beam is condensed into a linear beam and is irradiated to the amorphous silicon film so that a crystalline silicon film is formed.

Note that, in this embodiment, although the crystalline silicon film to become a semiconductor layer is formed from the amorphous silicon film, a microcrystalline silicon film may be used instead of the amorphous silicon film, and the crystalline silicon film may be directly formed.

The thus formed crystalline silicon film is patterned to form island-like semiconductor layers 403, 404 and 405.

Next, a gate insulating film 406 containing silicon oxide or silicon nitride as its main component is formed to cover the island-like semiconductor layers 403, 404 and 405. As the gate insulating film 406, a silicon nitride oxide film having a thickness of 100 to 200 nm, preferably 50 to 150 nm may be formed by the plasma CVD method using $N_2O$ and $SiH_4$ as raw materials. Here, the thickness is made 100 nm.

Then, a first conductive film 407 to become a first gate electrode and a second conductive film 408 to become a second gate electrode are formed on the surface of the gate insulating film 406. The first conductive film 407 may be formed of a kind of element selected from Si and Ge or a semiconductor film containing such an element as its main ingredient. Besides, it is necessary that the thickness of the first conductive film is made 5 to 50 nm, preferably 10 to 30 nm. Here, a Si film having a thickness of 20 nm is formed.

An impurity element to give an n type or p type may be added to a semiconductor film used as the first conductive film 407. A method of forming this semiconductor film may follow a well-known method, and for example, the film can be formed by a low pressure CVD method in which the substrate temperature is made 400 to 500° C., and disilane ($Si_2H_6$) of 250 SCCM and helium (He) of 300 SCCM are introduced. At the same time, an n-type semiconductor film may be formed by mixing $PH_3$ of 0.1 to 2% into $Si_2H_6$.

The second conductive film 408 to become the second gate electrode may be made of an element selected from Ti, Ta, W and Mo or a compound containing such an element as its main ingredient. This is considered to lower electrical resistance of the gate electrode, and for example, a Mo—W compound may be used. Here, Ta is used and the film is formed to a thickness of 200 to 1000 nm, typically 400 nm by the sputtering method (FIG. 11A).

Next, a step is carried out in which a resist mask is formed by using a well-known patterning technique, and the second conductive film 408 is etched to form the second gate electrode. Since the second conductive film 408 is formed of the Ta film, etching is performed by a dry etching method. The dry etching is performed under the conditions that $Cl_2$ of 80 SCCM is introduced and a high frequency electric power of 500 W is applied under 100 m Torr. Then, as shown in FIG. 11B, second gate electrodes 409, 410, 412 and 413, and wiring lines 411 and 414 are formed. With respect to the lengths of the second gate electrodes in the channel length direction, the length of each of the second gate electrodes 409 and 410 forming the CMOS circuit is made 3 µm, and the pixel TFT has a multi-gate structure and the length of each of the second gate electrodes 412 and 413 is made 2 µm.

The second conductive film 408 can also be removed by a wet etching method. For example, in the case of Ta, it can be easily removed by a hydrofluoric acid based etching solution.

Besides, a structure is adopted in which a holding capacitance is provided at a drain side of an n-channel TFT constituting the pixel TFT. At this time, the wiring electrode 414 of the holding capacitance can be formed of the same material as the second conductive film.

Next, a step of adding a first impurity element to give the n type is carried out. In this step, the second impurity regions are formed. Here, an ion doping method using phosphine ($PH_3$) is carried out. In this step, since phosphorus is added to the semiconductor layers 403, 404 and 405 through the gate insulating film 406 and the first conductive film 407, the acceleration voltage is set as high as 80 keV. It is preferable that the concentration of phosphorus added to the semiconductor layers 403, 404 and 405 is made within the range of $1\times10^{16}$ to $1\times10^{19}$ atoms/cm$^3$, and here, it is made $1\times10^{18}$ atoms/cm$^3$. Then, regions 415, 416, 417, 418, 419, 420, 421 and 422 where phosphorus is added in the semiconductor layers are formed (FIG. 11B).

At this time, phosphorus is also added to a region of the first conductive film 407 which does not overlap with the second gate electrodes 409, 410, 411, 412, 413 and 414. Although the concentration of phosphorus in this region is not particularly regulated, an effect of lowering the resistivity of the first conductive film can be obtained.

Next, regions where the n-channel TFTs are to be formed are covered with resist masks 423 and 424, and a step of removing a part of the first conductive film 407 is carried out by a dry etching method. The first conductive film 407 is made of Si, and the dry etching is carried out under the conditions that $CF_4$ of 50 SCCM and $O_2$ of 45 SCCM are introduced, and a high frequency electric power of 200 W is applied under 50 m Torr. As a result, there remain parts 425, 426, 427 and 428 of the first conductive film covered with the resist masks or the gate electrodes.

Then, a step of adding a third impurity element to give a p-type into a region where a p-channel TFT is to be formed is carried out. Here, dibolane ($B_2H_6$) is used and the element is added by an ion doping method. Also in this step, the acceleration voltage is made 80 keV, and boron is added at a concentration of $2\times10^{20}$ atoms/cm$^3$. As shown in FIG. 11C, third impurity regions 429 and 430 where boron is added at a high concentration are formed (FIG. 11C).

Further, the resist masks 423 and 424 are completely removed, and resist masks 431, 432, 433, 434, 435 and 436 are again formed. Then the resist masks 431, 434, 435 and 436 are used to etch the parts 425 and 428 of the first conductive film and parts 437, 438, 439 and 440 of the first conductive film are newly formed (FIG. 12A).

The resist mask 431 is formed to a length of 9 µm, and the resist masks 434 and 435 are respectively formed to a length of 7 µm. Accordingly, in the semiconductor layers added with phosphorus in the step of adding the first impurity element to give the n type, the under regions covered with the resist masks 431, 434 and 435 are defined as second impurity regions after a next step.

Next, a step of adding a second impurity element to give the n type is carried out. Here, an ion doping method using phosphine ($PH_3$) is carried out. Also in this step, since phosphorus is added to the semiconductor layer through the gate insulating film 406, the acceleration voltage is set as high as 80 keV. Then first impurity regions 441, 442, 443, 444 and 445 added with phosphorus are formed. The concentration of phosphorus in the regions is high as compared with that of the step of adding the first impurity element to give the n type, and it is preferable that the concentration is made $1\times10^{19}$ to $1\times10^{21}$ atoms/cm$^3$, and here. $1\times10^{20}$ atoms/cm$^3$ (FIG. 12A).

Further, the resist masks 431, 432, 433, 434, 435 and 436 are removed and resist masks 446, 447, 448, 449, 450 and 451 are newly formed. In this step, the lengths in the channel length direction of the resist masks 446, 449, and 450 formed on the n-channel TFTs are important in determination of the structure of the TFTs. The resist masks 446, 449 and 450 are provided in order to remove a part of the first conductive films 437, 438 and 439, and by the lengths of the resist masks, a region where the second impurity region overlaps with the gate electrode and a region where it does not overlap with the gate electrode can be freely determined within a certain range (FIG. 12B).

Then, first gate electrodes 452, 453 and 434 are formed by etching using the resist masks 446, 449 and 450 as shown in FIG. 12C. Here, the length of the first gate electrode 452 in the channel length direction is made 6 μm, and the lengths of the first gate electrodes 453 and 454 are made 4 μm.

Besides, an electrode 455 of a holding capacitance portion is formed in the pixel portion.

After the steps up to FIG. 12C are ended, a step of forming a silicon nitride film 456 and a first interlayer insulating film 457 are carried out. First, the silicon nitride film 456 is formed to a thickness of 50 nm. The silicon nitride film 456 is formed by the plasma CVD method under the conditions that $SiH_4$ of 5 SCCM, $NH_3$ of 40 SCCM, and $N_2$ of 100 SCCM are introduced, and a high frequency electric power of 300 W is applied under 0.7 Torr. Subsequently, a silicon oxide film is adopted as the first interlayer insulating film 457. Under the condition that TEOS of 500 SCCM and $O_2$ of 50 SCCM are introduced, and a high frequency of 200 W is applied under 1 Torr, the film of a thickness of 950 nm is formed.

Next, a step of heat treatment is carried out. It is necessary to carry out the step of heat treatment for the purpose of activating impurity elements to give the n type or p type added at the respective concentration. This step may be carried out by a heat annealing method using an electric heating furnace, the foregoing laser annealing method using the excimer laser, or a rapid thermal annealing method (RTA method) using a halogen lamp. Here, the step of activation is carried out using the thermal annealing method. The heating treatment is carried out in a nitrogen atmosphere, at 300 to 700° C., preferably 350 to 550° C., here 450° C. for 2 hours.

Thereafter, the first interlayer insulating film 457 and the silicon nitride film 456 are etched to form contact holes reaching source regions and drain regions of the respective TFTs by patterning. Then source electrodes 458, 459 and 460 and drain electrodes 461 and 462 are formed. Although not shown, in this embodiment, a three-layer structure is used as the electrodes, in which a Ti film with a thickness of 100 nm, an Al film containing Ti with a thickness of 300 nm, and a Ti film with a thickness of 150 nm are continuously formed by a sputtering method.

Then, a passivation film 463 is formed to cover the source electrodes 458, 459 and 460, the drain electrodes 461 and 462, and the first interlayer insulating film 457. The passivation film 463 is formed of a silicon nitride film having a thickness of 50 nm. Further, a second interlayer insulating film 464 made of organic resin is formed to a thickness of about 1000 nm. As the organic resin, polyimide, acryl, polyimide amide, or the like can be used. As merits of using the organic resin film, it is possible to enumerate a point that a film growth method is simple, a point that parasitic capacitance can be reduced since relative dielectric constant is low, a point that flatness is superior, and the like. Besides, the organic resin film except the above may be used. Here, polyimide which has a type in which thermal polymerization is performed after application onto a substrate is used, and is fired at 300° C. to form the film.

By the above steps, a channel formation region 465, first impurity regions 468 and 469, and second impurity regions 466 and 467 are formed in the n-channel TFT of the CMOS circuit. Here, in the second impurity regions, regions (GOLD region) 466a and 467a overlapping with the gate electrode are formed to a length of 1.5 μm, and regions (LDD region) 466b and 467b not overlapping with the gate electrode are formed to a length of 1.5 μm. The first impurity region 468 becomes, a source region, and the first impurity region 469 becomes a drain region.

In the p-channel TFT, a gate electrode of a clad structure is similarly formed, and a channel formation region 470 and third impurity regions 471 and 472 are formed. The third impurity region 471 becomes a source region, and the third impurity region 472 becomes a drain region.

The n-channel TFT of the pixel TFT has a multigate, and channel formation regions 473 and 478, first impurity regions 476, 477 and 481, and second impurity regions 474, 475, 479 and 480 are formed therein. Here, in the second impurity regions, regions 474a, 475a, 479a, and 480a overlapping with the gate electrode, and regions 474b, 475b, 479b and 480b not overlapping with the gate are formed.

Figure 13:
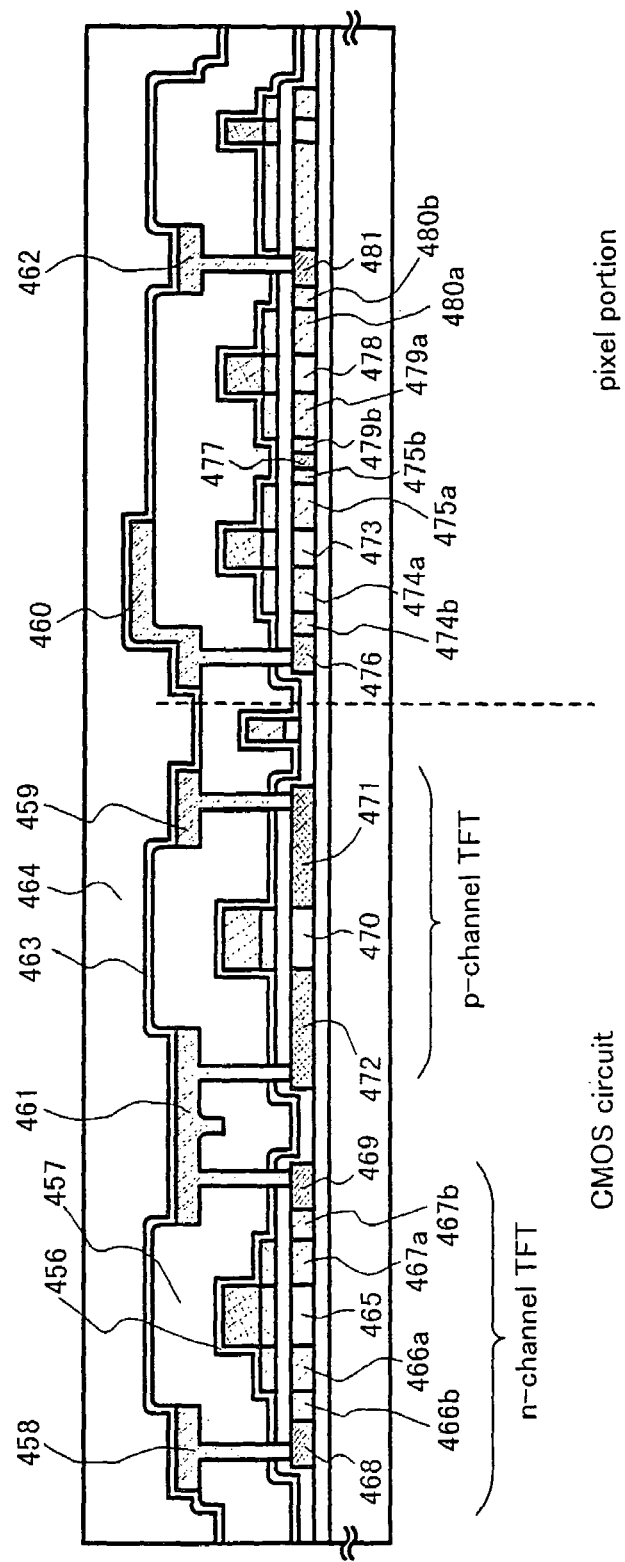
FIG. 13 is a sectional view of an active matrix substrate.

In this way, as shown in FIG. 13, the active matrix substrate in which the CMOS circuit and the pixel TFT are formed on the substrate 401 is fabricated. Besides, the holding capacitance portion is simultaneously formed at the drain side of the n-channel TFT as the pixel TFT.

Embodiment 4

In this embodiment, an example in which a part of a first conductive film is removed by another method after the state shown in FIG. 12A is obtained by the same steps as the embodiment 3, will be described with reference to FIG. 14.

Figure 14:
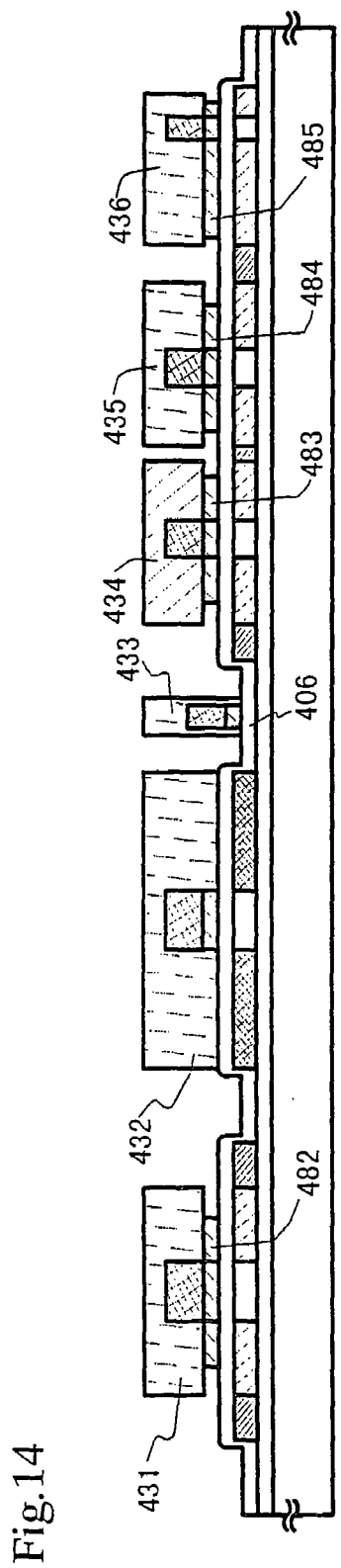
FIG. 14 is a sectional views showing a fabricating step of a TFT.

First, resist masks 431, 432, 433, 434, 435 and 436 formed in FIG. 12A are used as they are, and a part of first conductive films 437, 438, 439 and 440 of FIG. 12A are removed by etching, so that the first conductive films are formed into shapes as 482, 483, 484 and 485 of FIG. 14.

In the case where the first gate electrode is a silicon film, the etching step here can be carried out by a dry etching method in which $SF_6$ of 40 SCCM and $O_2$ of 10 SCCM are introduced and a high frequency electric power of 200 W is applied under 100 m Torr.

In this condition of the dry etching, a selecting ratio to a gate insulating film as an under film is high, and the gate insulating film 406 is hardly etched.

Here, the resist mask 431 is formed to a length of 9 μm in the channel length direction of the TFT, and the resist masks 434 and 435 are formed to a length of 7 μm. Then, the first conductive films are removed with a dry etching by 1.5 μm, and the first gate electrodes 482, 483, 484 and 485 are formed.

When the resist masks 431, 432, 433, 434, 435 and 436 are removed, parts relating to TFTs come to have the state of FIG. 12C. The subsequent steps may follow the embodiment 3, and as shown in FIG. 13, a silicon nitride film 456, a first interlayer insulating film 457, source electrodes 458, 459 and 460, drain electrodes 461 and 462, a passivation film 463, and a second interlayer insulating film 464 are formed, and the active matrix substrate shown in FIG. 13 is formed.

Embodiment 5

In this embodiment, an example will be described in which a crystalline semiconductor film used as semiconductor layers in the embodiment 3 is formed by a thermal crystallization method using a catalytic element. In the case of using a catalytic element, it is preferable to use technologies disclosed in Japanese Patent Laid-Open No. 7-130652 and Japanese Patent Laid-Open No. 8-78329.

Here, an example will be described in FIG. 15 in which the technology disclosed in Japanese Patent Laid-Open No. 7-130652 is applied to the present invention. First, a silicon oxide film 1202 is formed on a substrate 1201 and then an amorphous silicon film 1203 is formed thereon. Further, a nickel acetate solution containing 10 ppm by weight of nickel is applied thereon to form a nickel-containing layer 1204 (see FIG. 15A).

Next, the substrate is subjected to dehydrogenation at 500° C. for one hour and then is subjected to a heat treatment at 500° C. to 650° C. for 4 hours to 12 hours (in the present preferred embodiment, at 550° C. for 8 hours) to form a crystalline silicon film 1205. The crystalline silicon film 1205 formed in this manner (also, called polysilicon) has a very excellent crystalline property (see FIG. 15B).

Also, the technology disclosed in Japanese Patent Laid-Open No. 8-78329 makes it possible to crystallize an amorphous semiconductor film selectively by adding a catalytic element selectively. An example in which this technology is applied to the present invention will be described with reference to FIG. 16.

First, a silicon oxide film 1302 is formed on a glass substrate 1301 and then an amorphous silicon film 1303 and a silicon oxide film 1304 are formed in sequence thereon. At that time, the thickness of the silicon oxide film 1304 is made 150 nm.

Figure 16A:
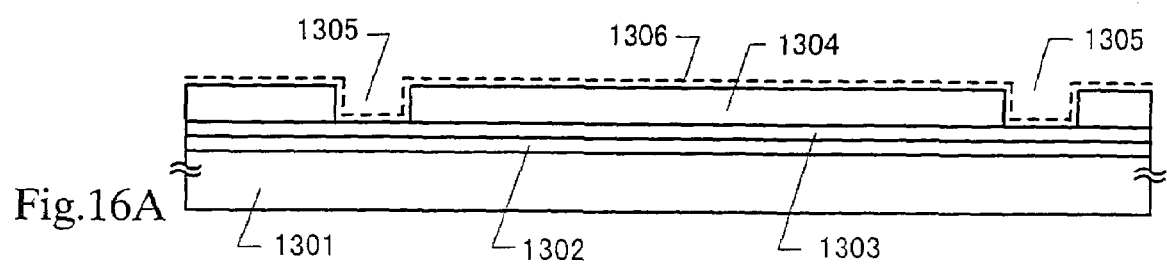
FIGS. 16A and 16B are views showing fabricating steps of a crystalline silicon film.

Next, the silicon oxide film 1304 is patterned to form apertures 1305 selectively and then a nickel acetate solution containing 10 ppm by weight of nickel is applied thereon to form a nickel-containing layer 1306 and the nickel containing layer 13.06 is brought into contact with the amorphous silicon film 1303 only at the bottom of the aperture 1305 (FIG. 16A).

Figure 16B:
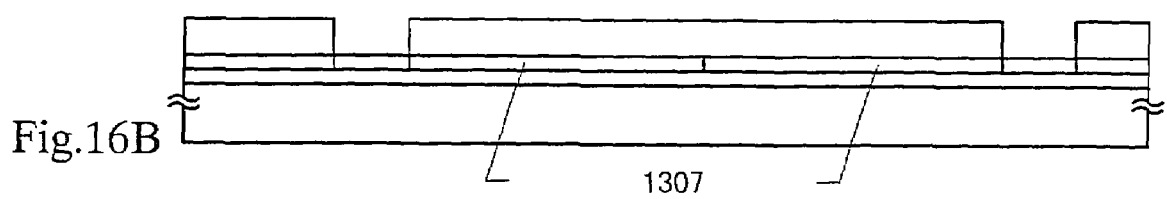

Next, the substrate is subjected to a heat treatment at 500° C. to 650° C. for 4 hours to 24 hours (in the present preferred embodiment, at 570° C. for 14 hours) to form a crystalline silicon film 1307. In this crystallization process, a part of the amorphous silicon film in contact with nickel is first crystallized and then crystallization proceeded in the lateral direction. The crystalline silicon film 1307 formed in this way forms a crystalline texture including bar-shaped or needle-shaped crystals and each crystal thereof grows macroscopically in a specific direction and hence is uniform in crystalline property, which is an advantage of this crystalline silicon film 1307. (FIG. 16B)

In this respect, in the two technologies described above, the following catalytic elements may be used in addition to nickel (Ni): germanium (Ge), iron (Fe), palladium (Pd), tin (Sn), lead (Pb), cobalt (Co), platinum (Pt), copper (Cu), and gold (Au).

The semiconductor layer of the crystalline TFT can be formed by forming a crystalline semiconductor film (including a crystalline silicon film, a crystalline silicon germanium film, or the like) and then by patterning it. The TFT made of a crystalline semiconductor film by using the technology of the present preferred embodiment can produce an excellent characteristic and hence has been required to be of high reliability. However, the adoption of the TFT structure in accordance with the present invention can produce a TFT making the most use of the technology of the present preferred embodiment.

Embodiment 6

In this embodiment, a method in which a crystalline semiconductor film is formed by using an amorphous semiconductor film as a starting film, and by using the above described catalytic element and then the catalytic element is removed from the crystalline semiconductor film, will be described as a method of forming the semiconductor layers used in the embodiment 3. In the present preferred embodiment 3, the technologies disclosed in Japanese Patent Laid-Open No. 10-135468 or Japanese Patent Laid-Open No. 10-135469 are used as the method.

The technology disclosed in the above references is the one removing a catalytic element used for the crystallization of an amorphous semiconductor film by the gettering action of phosphorus after the crystallization. The concentration of the catalytic element in the crystalline semiconductor film can be reduced to $1 \times 10^{17}$ atoms/cm$^3$ or less, more preferably, $1 \times 10^{16}$ atoms/cm$^3$ or less, by using this technology.

Figure 17A:
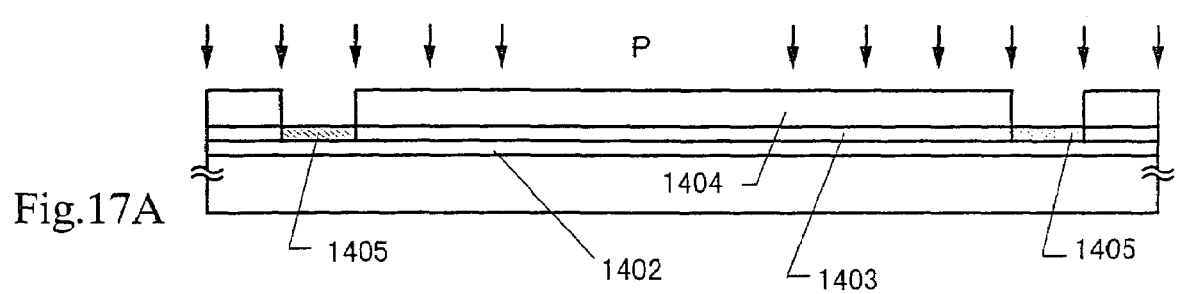
FIGS. 17A and 17B are views showing fabricating steps of a crystalline silicon film.
Figure 17B:
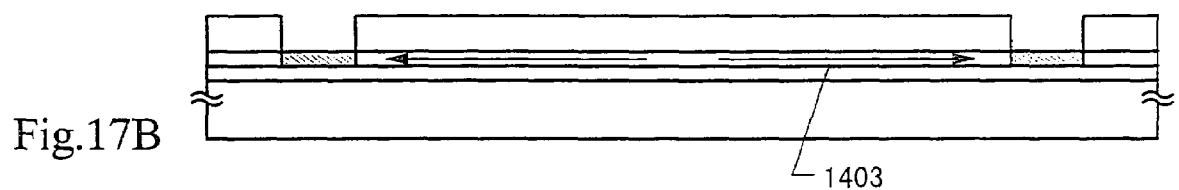

The constitution of the present preferred embodiment will be described with reference to FIG. 17. Here, a nonalkali glass substrate, typically, a 1737 substrate made by Corning Corp., is used. FIG. 17A shows a state in which an underlayer film 1402 and a crystalline silicon film 1403 are formed by using the technology of crystallization described in the embodiment 5. Then, a silicon oxide film 1404 for masking is formed on the surface of the crystalline silicon film 1403 to a thickness of 150 nm and then apertures are formed by patterning to form regions exposing the crystalline silicon film 1403. Then, a phosphorus addition process is performed to form the regions 1405 to which phosphorus is added in the crystalline silicon film.

The substrate in this state is subjected to a heat treatment in a nitrogen atmosphere at 550° C. to 800° C. for 5 hours to 24 hours (in the embodiment, at 600° C. for 12 hours), whe region 1405 to which the phosphorus is added acted on the crystalline silicon film 1403 as a gettering site to move catalytic elements remaining in the crystalline silicon film 1403 to the regions 1405 to which the phosphorus is added. (FIG. 17B) Then, the silicon oxide film 1404 for masking and the region 1405 to which the phosphorus is added are removed by etching to form a crystalline silicon film in which the concentration of the catalytic element used in the crystallization process is reduced to $1 \times 10^{17}$ atoms/cm$^3$ or less. This crystalline silicon film can be used as it, is as the semiconductor layer of the TFT in accordance with the present invention described in the embodiment 3.

Embodiment 7

Figure 18A:
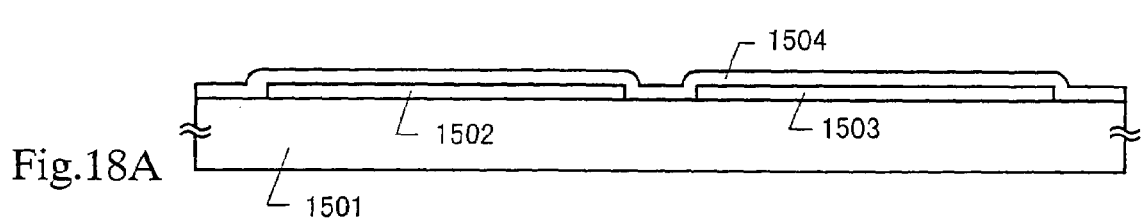
FIGS. 18A and 18B are views showing fabricating steps of a crystalline silicon film.
Figure 18B:
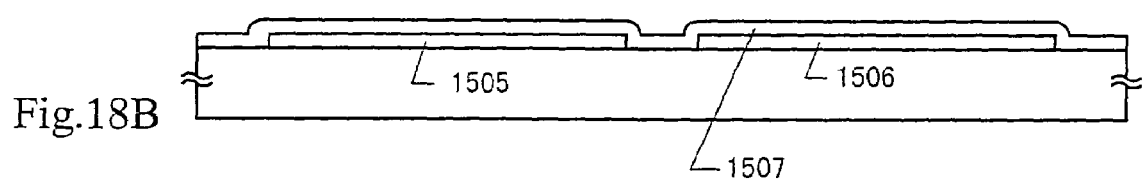

In this embodiment, the other preferred embodiment for forming the semiconductor layers and the gate insulating film in the process for forming the TFT in accordance with the present invention described in the embodiment 3 will be described. The constitution of this embodiment is shown in FIG. 18.

Here, a substrate needed to have a heat resistance up to about 700° C. to 1100° C. and a quartz substrate 1501 is used. Then, a crystalline semiconductor film is formed by using the technology described in the embodiments 5, 6 and then is patterned into an island shape to make the active layer of the TFT, whereby semiconductor layers 1502, 1503 are formed. Then, a gate insulating film 1504 covering the semiconductor layers 1502, 1503 is formed of the film whose main constituent is silicon oxide. In the present preferred embodiment, a silicon nitride oxide film is formed to a thickness of 70 nm by a plasma CVD method (see FIG. 18A).

Then, the substrate is subjected to a heat treatment in an atmosphere containing halogen (typically, chlorine) and oxygen at 950° C. for 30 minutes in the present embodiment. In this respect, a treatment temperature may be selected in a range of 700° C. to 1100° C. and a treatment time may be selected in a range of 10 minutes to 8 hours (see FIG. 18B).

As a result, under the conditions of the present embodiment, a thermal oxide film is formed at an interface between the semiconductor layers 1502, 1503 and the gate insulating film 1504 and a gate insulating 1507 which is combined with deposited gate insulating film 1504 is formed. Further, the impurity contained in the gate insulating film 1504 and in the semiconductor layers 1502 and 1503, especially a metallic impurity element, forms a compound with the halogen and can be removed in the gas phase in this oxidation process in the halogen atmosphere.

The gate insulating film 1507 formed by the processes described above has a high insulation voltage and an interface between the semiconductor layers 1505, 1506 and the gate insulating film 1507 is very good. In order to produce a TFT in accordance with the present invention, the same processes used in the preferred embodiment 3 may be used in the following processes.

Embodiment 8

In the fabrication method for forming the crystalline semiconductor film by the method described in the embodiment 5 and the active material substrate by the steps shown in the embodiment 3, this example represents the example where the catalytic element used for the crystallization process is removed by gettering. First, in Embodiment 3, the semiconductor layers 403, 404 and 405 shown in FIG. 11A are the crystalline silicon films using the catalytic element. Since the catalytic element used for the crystallization process remains in the semiconductor layer at this time, the gettering process is preferably carried out.

Here, the process step shown in FIG. 11C is as such carried out. After that, the resist masks 423 and 424 are removed.

Then, new resist masks 1601, 1602, 1603, 1604, 1605 and 1606 are formed as shown in FIG. 19A. Next, the formation step of the second impurity region is conducted by adding the n-type imparting impurity. There are thus formed the regions 1607, 1608, 1609, 1610, 16111, 1612 and 1613 in which phosphorus is added into the semiconductor layer.

Boron as the p-type imparting impurity element has been already added to these P-doped regions 1609 and 1610. The P concentration at this time is $1\times10^{19}$ to $1\times10^{20}$ atoms/cm$^3$ and is about ½ of the concentration of boron. Therefore, no influences are observed on the characteristics of the p-channel TFT.

Heat-treatment is carried out under this state at 400 to 800° C. for 1 to 24 hours, for example, at 600° C. for 12 hours, in a nitrogen atmosphere. This step can activate the n-type and p-type imparting impurity elements. Furthermore, because the P-doped regions function as the gettering site, the catalytic elements remaining after the crystallization step can be segregated. As a result, the catalytic element can be removed from the channel formation region (FIG. 19B).

After the process step in FIG. 19B is completed, the subsequent steps are conducted in the same way as those in Embodiment 3, and the active matrix substrate can be fabricate by forming the state of FIG. 13.

Embodiment 9

In this embodiment, the process step for fabricating an active matrix liquid crystal display device from the active matrix substrate fabricated in the embodiment 3 will be explained.

Figures 20A, 20B:
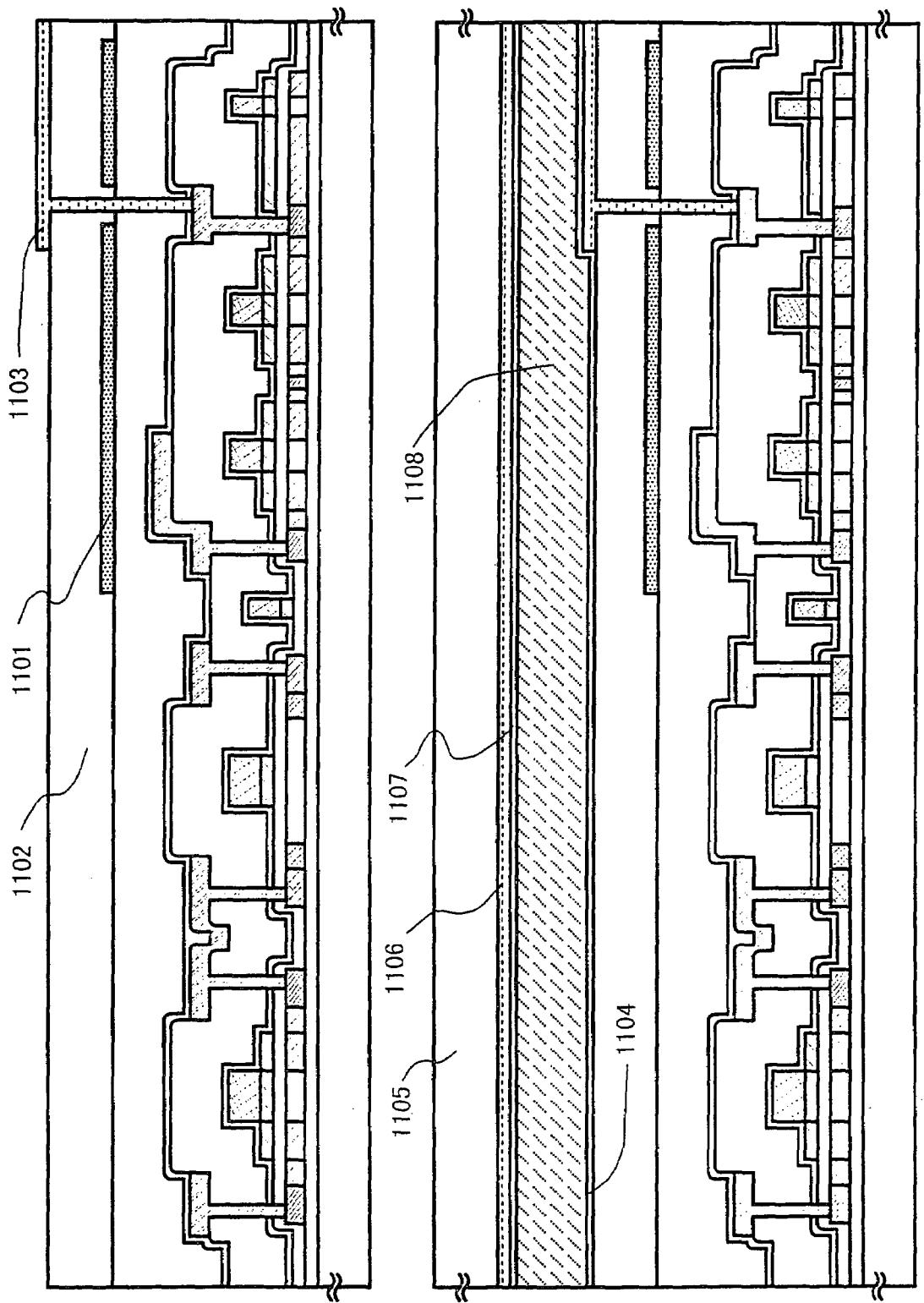
FIGS. 20A and 20B are sectional views showing fabricating steps of a liquid crystal display device.

A light shielding film 1101 and third interlayer insulating film 1102 are formed as shown in FIG. 20A over the active matrix substrate under the state shown in FIG. 13. An organic resin film containing pigment and a metal film such as Ti and Cr are used for the light shielding film 1101. The third inter-layer insulation film is further formed. The third inter-layer insulation film 1102 is composed of an organic resin film such as polyimide. Contact holes reaching the drain electrode 462 are formed in the third inter-layer insulation film 1102, the second inter-layer insulation film 464 and the passivation film 463, and then pixel electrode 103 is formed. The pixel electrode 1103 uses a transparent conductive film for a transmission type liquid crystal display device, and a metallic film for a reflection type liquid crystal display device. Since this example deals with the transmission type liquid crystal display device, an indium oxide-tin (ITO) film is formed by sputtering to a thickness of 100 nm, giving the pixel electrode 1103.

Next, as shown in FIG. 20B, an orientation film 1104 is formed so as to cover the surface of the third inter-layer insulation film 1102 and the pixel electrode 1103. Generally, the liquid crystal display device uses a polyimide resin for the orientation film in most cases. A transparent conductive film 1106 and an orientation film 1107 are formed on the substrate 1105 on the opposite side. After the orientation film is formed, it is subjected to rubbing treatment so that the liquid crystal molecules are oriented in parallel with a certain predetermined pre-tilt angle.

After the above-described process steps are completed, the active matrix substrate on which the pixel TFT and the CMOS circuit has been formed and the opposing substrate are bonded through a sealant and spacers (both are not shown) by a known cell assembly step. Thereafter, a liquid crystal material 1108 is injected between both substrates and is completely sealed by a sealant (not shown). The active matrix type liquid crystal display device shown in FIG. 20B is thus completed.

Further, while the TFT formed by above described steps has a top gate structure, the present invention can be also applied to the TFT which has the bottom gate structure or the other type structure.

The present invention can be also applied to the self emission type display device, the EL display device using EL (Electro Luminescence) materials substituting for liquid crystal material.

Embodiment 10

An example of manufacturing an EL display device, also called a light emitting device or a light emitting diode, using the Embodiments 1 and 2 is explained in this embodiment. The EL device referred to in this specification include triplet-based light emission device and singlet-based light emission device, for example.

Figure 21A:
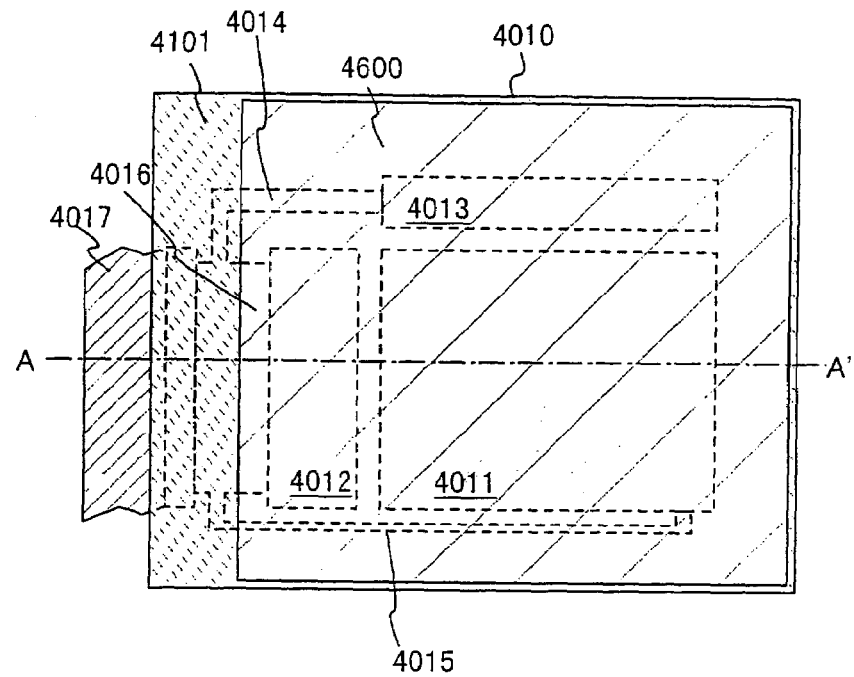
FIGS. 21A and 21B are views showing a fabrication example of an EL display device.
Figure 21B:
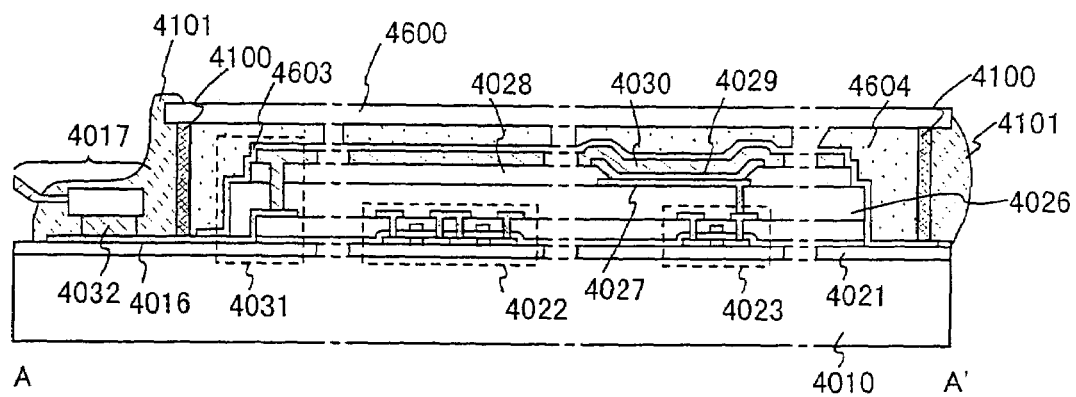

FIG. 21A is a top view of an EL display device using the present invention. Further, FIG. 21B is a cross sectional structure of the EL display device of the present invention when FIG. 21A is cut along the line A–A'. In FIG. 21A, reference numeral 4010 is a substrate, reference numeral 4011 is a pixel portion, reference numeral 4012 is a source signal side driver circuit, and reference numeral 4013 is a gate signal side driver circuit. Each driver circuit is connected to external equipment, through an FPC 4017 via wirings 4014 to 4016.

A covering material 4600, a sealing material (also referred to as a housing material) 4100, and an airtight sealing material (a second sealing material) 4101 are formed so as to enclose at least the pixel portion, preferably the driver circuits and the pixel portion, at this point.

As shown in FIG. 21B, a driver circuit TFT 4022 (note that a CMOS circuit in which an n-channel TFT and a p-channel TFT are combined is shown in the figure here), a pixel portion TFT 4023 (note that only an EL driver TFT for controlling the current flowing to an EL element is shown here) are formed on a base film 4021 on a substrate 4010. The TFTs may be formed using a known structure (a top gate structure or a bottom gate structure).

After the driver circuit TFT 4022 and the pixel portion TFT 4023 are completed, a pixel electrode 4027 is formed on an interlayer insulating film (leveling film) 4026 made from a resin material. The pixel electrode is formed from a transparent conducting film for electrically connecting to a drain of the pixel TFT 4023. An indium oxide and tin oxide compound (referred to as ITO) or an indium oxide and zinc oxide compound can be used as the transparent conducting film. An insulating film 4028 is formed after forming the pixel electrode 4027, and an open portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In this embodiment, the EL layer is formed by evaporation using a shadow mask. Color display becomes possible by forming emitting layers (a red color emitting layer, a green color emitting layer, and a blue color emitting layer), capable of emitting light having different wavelengths for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to use a method of forming the EL layer 4029 and the cathode 4030 continuously, or depositing the EL layer 4029 in an inert gas atmosphere and the cathode 4030 without exposing to the air. The above film deposition becomes possible in this embodiment by using a multichamber method (cluster tool method) film deposition apparatus.

Note that a lamination structure of a LiF (lithium fluoride) film and an Al (aluminum) film is used in this embodiment as the cathode 4030. Specifically a 1 nm thick LiF (lithium fluoride) film is formed by evaporation on the EL layer 4029, and a 300 nm thick aluminum film is formed on the LiF film. An MgAg electrode, a known cathode material, may of course also be used. The cathode 4030 is then connected to wiring 4016 in a region denoted by reference numeral 4031. The wiring 4016 is an electric power supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 4603, a filling material 4604, and the covering material 4600 are formed covering the surface of the EL element thus made.

In addition, the sealing material 4100 is formed between the covering material 4600 and the substrate 4010, so as to surround the EL element portion, and the airtight sealing material (the second sealing material) 4101 is formed outside of the sealing material 4100.

The filling material 4604 also functions as an adhesive for bonding the covering material 4600 at this point. PVC (polyvinyl chloride), epoxy resin, silicone resin, PVB (polyvinyl butyral), and EVA (ethylene vinyl acetate) can be used as the filling material 4604. If a drying agent is formed inside of the filling material 4604, then it can continue to maintain a moisture absorbing effect, which is preferable.

Further, spacers may be contained within the filling material 4604. The spacers may be a powdered substance such as BaO, giving the spacers themselves the ability to absorb moisture.

When using spacers, the passivation film 4603 can relieve the spacer pressure. Further, a film such as a resin film can be formed separately from the passivation film to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material

4600. Note that if PVB or EVA is used as the filling material 4604, it is preferable to use a sheet with a structure in which several tens of μm of aluminum foil is sandwiched by a PVF film or a Mylar film.

However, depending upon the light emission direction from the EL element (the light radiation direction), it is necessary for the covering material 4600 to have light transmitting characteristics.

Further, the wiring 4016 is electrically connected to the FPC 4017 through a gap between the sealing material 4100, the sealing material 4101 and the substrate 4010. Note that although an explanation of the wiring 4016 has been made here, the wirings 4014 and 4015 are also electrically connected to the FPC 4017 by similarly passing underneath the sealing material 4100 and the sealing material 4101.

In this embodiment, the covering material 4600 is bonded after forming the filling material 4604, and the sealing material 4100 is attached so as to cover the lateral surfaces (exposed surfaces) of the filling material 4604, but the filling material 4604 may also be formed after attaching the covering material 4600 and the sealing material 4100. In this case, a filling material injection opening through a gap is formed formed by the substrate 4010, the covering material 4600, and the sealing material 4100. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Embodiment 11

An example of an EL display in accordance with the present invention, manufactured in a form different from that of Embodiment 10 according to the present invention, will be described with reference to FIGS. 22A and 22B. Portions or components identical or corresponding to those in FIGS. 21A and 21B are indicated by the same reference characters, and the description for them will not be repeated.

Figure 22A:
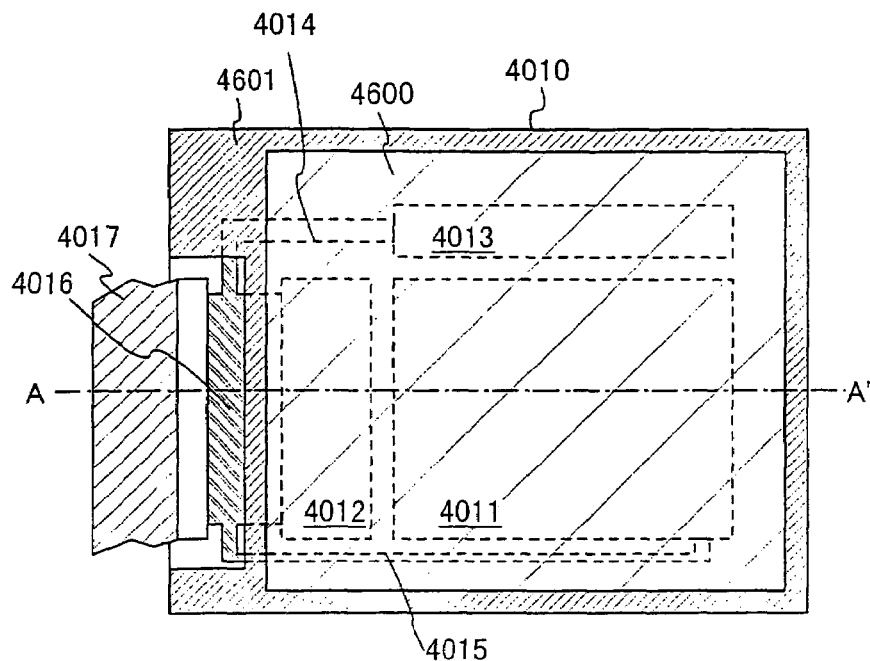
FIGS. 22A and 22B are views showing a fabrication example of an EL display device.
Figure 22B:
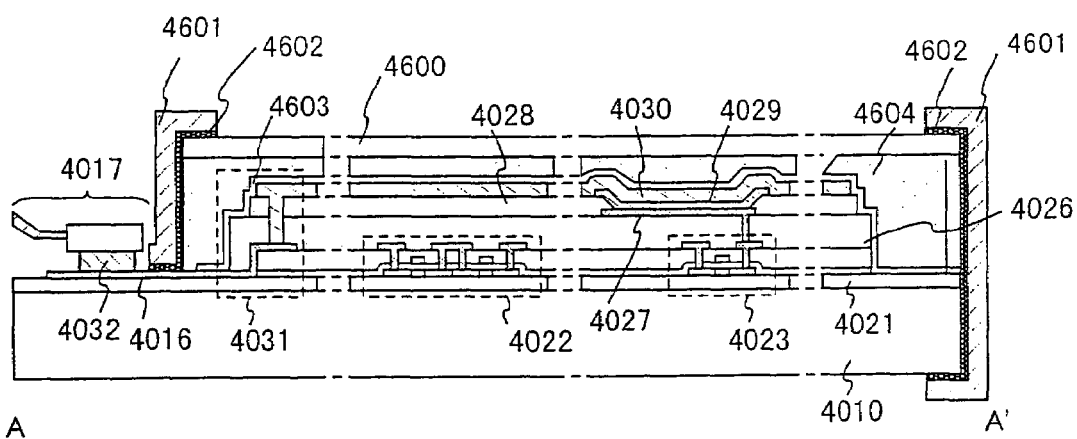

FIG. 22A is a top view of the EL display device of this embodiment, and FIG. 22B is a cross-sectional view taken along the line A–A' in FIG. 22A.

Internal portions of the EL device below a passivation film 4603 which covers a surface of the EL element are formed in the same manner as Embodiment 10.

Further, a filler 4604 is provided so as to cover the EL element. The filler 4604 also functions as an adhesive for bonding a cover member 4600. As filler 4604, polyvinyl chloride (PVC), epoxy resin, silicone resin, polyvinyl butyral (PVB) or ethylene-vinyl acetate (EVA) may be used. Preferably, a desiccant is provided in the filler 4604 to maintain a moisture absorbing effect.

The filler 4604 may also contain a spacer. The spacer may be particles of BaO or the like such that the spacer itself has a moisture absorbing effect.

If a spacer is provided, the passivation film 4603 can reduce the influence of the spacer pressure. A resin film or the like may also be provided independently of the passivation film to reduce the influence of the spacer pressure.

As the cover member 4600, a glass sheet, an aluminum sheet, a stainless steel sheet, a fiberglass-reinforced plastic (FRP) sheet, polyvinyl fluoride (PVF) film, Mylar film, polyester film, acrylic film, or the like may be used. If PVB or EVA is used as filler 6004, it is preferable to use a sheet having a structure in which an aluminum foil having a thickness of several tens of m is sandwiched between PVF or Mylar films.

Some setting of the direction of luminescence from the EL element (the direction in which light is emitted) necessitates making the cover member 4600 transparent.

Next, the cover member 4600 is bonded by using the filler 4604. Thereafter, a frame member 4601 is attached so as to cover side surfaces (exposed surfaces) formed by the filler 4604. The frame member 4601 is bonded by a sealing member 4602 (functioning as an adhesive). Preferably, a photo-setting resin is used as sealing member 4602. However, a thermosetting resin may be used if the heat resistance of the EL layer is high enough to allow use of such a resin. It is desirable that the sealing member 4602 has such properties as to inhibit permeation of moisture and oxygen as effectively as possible. A desiccant may be mixed in the sealing member 4602.

Also wiring 4016 is electrically connected to a flexible printed circuit FPC 4017 by being passed through a gap between the sealing member 4602 and the substrate 4010. While the electrical connection of the wiring 4016 has been described, other wirings 4014 and 4015 are also connected electrically to the FPC 4017 by under the sealing member 4602.

In this embodiment, after the filler 4604 has been provided, the cover member 4600 is bonded and the frame member 4601 is attached so as to cover the side surfaces (exposed surfaces) of the filler 4604. However, the filler 4604 may be provided after attachment of the cover member 4600 and the frame member 4601. In such a case, a filler injection hole is formed which communicates with a cavity formed by the substrate 4010, the cover member 4600 and the frame member 4601. The cavity is evacuated to produce a vacuum (at $10^{-2}$ Torr or lower), the injection hole is immersed in the filler in a bath, and the air pressure outside the cavity is increased relative to the air pressure in the cavity thereby filling the cavity with the filler.

Embodiment 12

Figure 23:
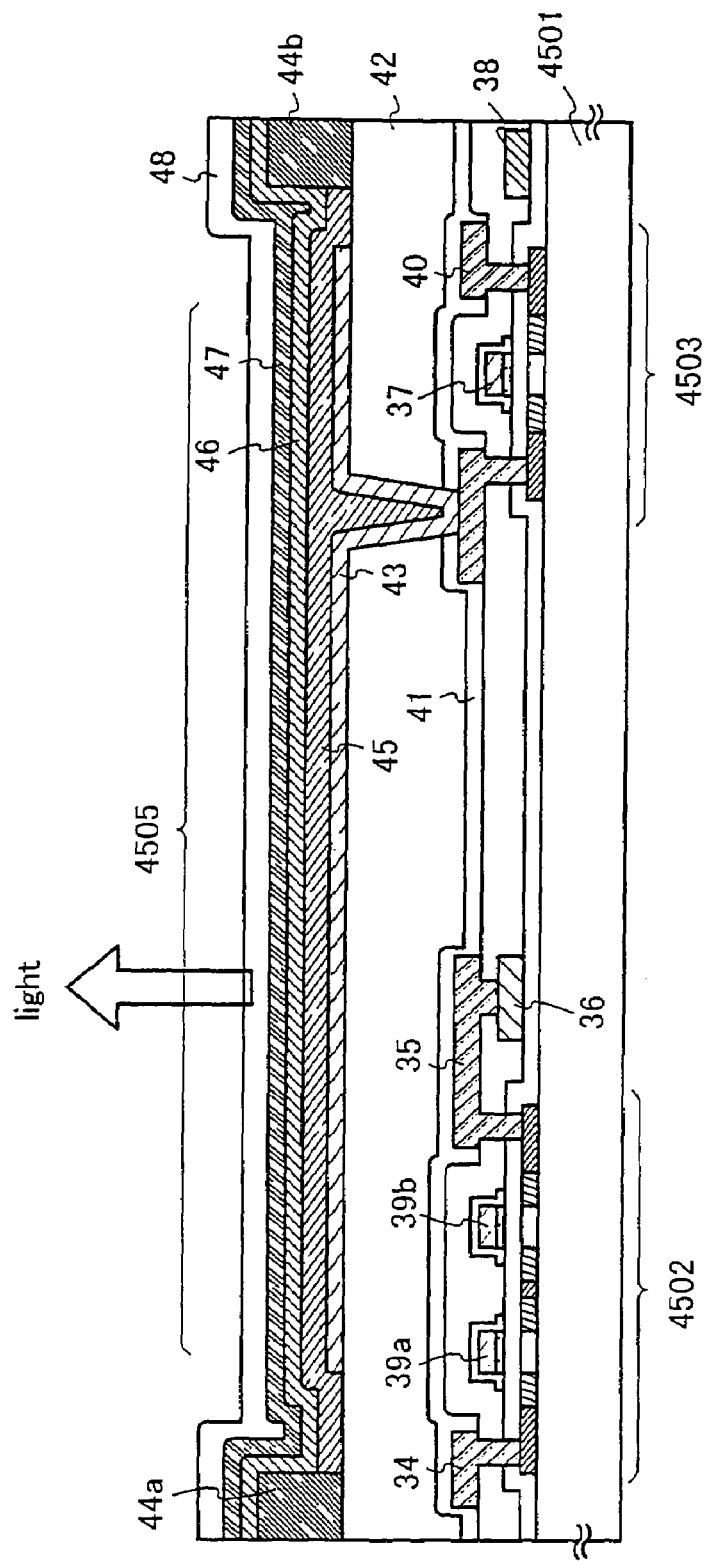
FIG. 23 is a view showing a fabrication example of an EL display device.
Figure 24A:
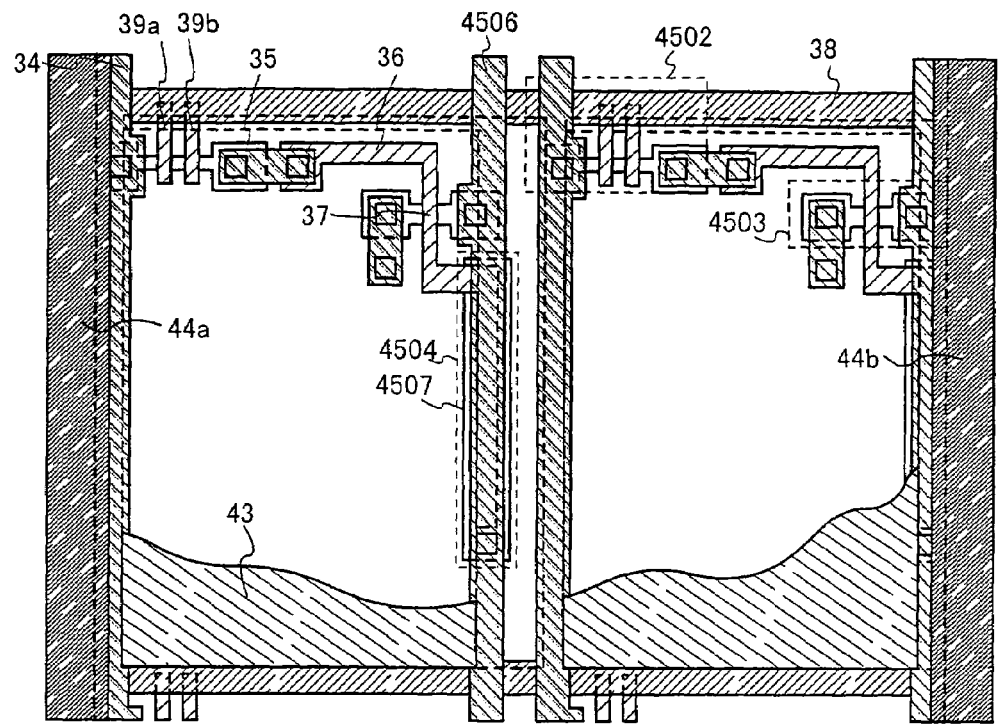
FIGS. 24A and 24B are views showing a fabrication example of the EL display device.
Figure 24B:
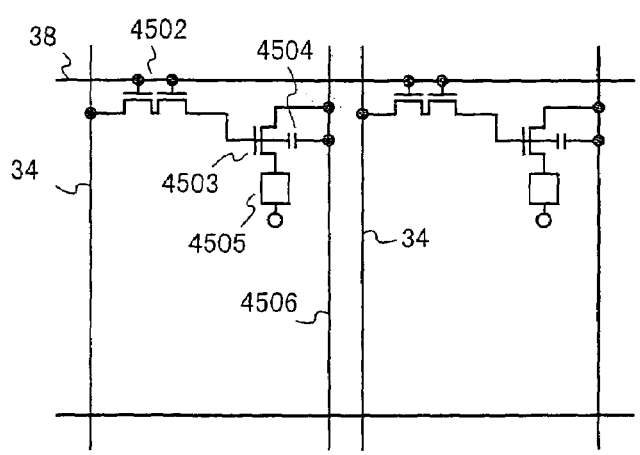

FIG. 23 shows a more detailed cross-sectional structure of the pixel portion of the EL display device. FIG. 24A shows a top view thereof, and FIG. 24B shows a circuit diagram thereof. Since common reference numerals are used in FIGS. 23, 24A and 24B, reference may be made to one another.

In FIG. 23, a TFT 4502 for switching provided on a substrate 4501 is formed by using the n-channel TFT formed by a known method. In this embodiment, the TFT 4502 has a double-gate structure. Since there is no substantial difference in its structure and the manufacturing processes, description will be omitted. Note that two TFTs are substantially connected in series in the double-gate structure so that there is an advantage that OFF current can be reduced. In this embodiment, the TFT 4502 has a double-gate structure, however, it may have a single gate structure, a triple gate structure, or a multi-gate structure having 4 or more gates. Alternatively the TFT 4502 for switching may be formed by using a p-channel TFT formed by a known method.

A TFT 4503 for controlling a current is formed by using the n-channel TFT formed by well-known method. The source wiring (source signal line) of the TFT 4502 for switching is denoted as reference numeral 34. A drain wiring 35 of the TFT 4502 for switching is electrically connected to a gate electrode 37 of the TFT for controlling a current by a wiring 36. Furthermore, a wiring denoted by reference numeral 38 is a gate wiring (gate signal line) electrically connected to gate electrodes 39a and 39b of the TFT 4502 for switching.

The TFT 4503 for controlling a current functions as an element for controlling the amount of a current flowing through an EL element, so that the element is likely to be degraded by heat and hot carriers due to a large amount of current flown therethrough. Therefore, the structure of the present invention is very effective, in which an LDD region is provided in the drain side of the TFT 4503 for controlling a current so as to overlap the gate electrode via the gate insulating film.

Furthermore, in this embodiment, the TFT 4503 for controlling a current has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 24A, the wiring 36 to be the gate electrode 37 of the TFT 4503 for controlling a current overlaps the power supply line 4506 connected to a drain wiring 40 of the TFT 4503 for controlling a current via an insulating film in a region denoted by reference numeral 4504. In the region 4504, a capacitor is formed. The capacitor functions for holding a voltage applied to the gate electrode 37 of the TFT 4503 for controlling a current. The storage capacitor 4504 is formed between the semiconductor film 4507 connected electrically to the power supply line 4506, an insulating film (not shown in figures) which is the same layer of the gate insulating film, and the wiring 36. Further, the capacitance, which is formed from the wiring 36, the same layer (not shown in figures) of a first interlayer insulating film and the power supply line 4506 can be used as a storage capacitor. The drain of the TFT for controlling a current is connected to a power supply line (power source line) 4506 so as to be always supplied with a constant voltage.

A first passivation film 41 is provided on the TFT 4502 for switching TFT and the TFT 4503 for controlling a current, and a leveling film 42 that is made of a resin insulating film is formed thereon. It is very important to flatten the step difference due to TFTs by using the leveling film 42. The step difference may cause a luminous defect because the EL layer to be formed later is very thin. Thus, it is desirable to flatten the step difference before forming a pixel electrode, so that the EL layer is formed on a flat surface.

Reference numeral 43 denotes a pixel electrode (cathode of an EL element) that is made of a conductive film with high reflectivity and is electrically connected to the drain of the TFT 4503 for controlling a current. As the pixel electrode 43, a low resistant conductive film such as an aluminum alloy film, a copper alloy film, and a silver alloy film, or a layered structure thereof can be preferably used. Needless to say, a layered structure with other conductive films may also be used.

A light-emitting layer 45 is formed in a groove (corresponding to a pixel) formed by banks 44a and 44b made of an insulating film (preferably, resin). In FIG. 24A, a portion of bank is eliminated to clarify the position of the storage capacitor 4504, so only the bank 44a and 44b are shown in figures. The banks are provided between the power supply line 4506 and the source line (source signal line) 34 to overlap the portion of the power supply line 4506 and the source line (source signal line) 34. Herein, only two pixels are shown; however, light-emitting layers corresponding to each color R (red), G (green), and B (blue)) may be formed. As an organic EL material for the light-emitting layer, a π-conjugate polymer material is used. Typical examples of the polymer material include polyparaphenylene vinylene (PPV), polyvinyl carbazole (PVK), and polyfluorene.

There are various types of PPV organic EL materials. For example, materials as described in "H. Shenk, H. Becker, O. Gelsen, E. Kluge, W. Kreuder and H. Spreitzer, "Polymers for Light Emitting Diodes," Euro Display, Proceedings, 1999, p. 33-37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm).

The above-mentioned organic EL materials are merely examples for use as a light-emitting layer. The present invention is not limited thereto. A light-emitting layer, a charge-transporting layer, or a charge injection layer may be appropriately combined to form an EL layer (for light emitting and moving carriers therefor).

For example, in this embodiment, the case where a polymer material is used for the light-emitting layer has been described. However, a low molecular-weight organic EL material may be used. Furthermore, an inorganic material such as silicon carbide can also be used for a charge-transporting layer and a charge injection layer. As these organic EL materials and inorganic materials, known materials can be used.

In this embodiment, an EL layer with a layered structure is used, in which a hole injection layer 46 made of PEDOT (polythiophene) or PAni (polyaniline) is provided on the light-emitting layer 45, and an anode 47 made of a transparent conductive film is provided on the hole injection layer 46. In this embodiment, light generated by the light-emitting layer 45 is irradiated toward the upper surface (the upper direction for the TFT), so that the anode 47 must be transparent to light. As a transparent conductive film, a compound of indium oxide and tin oxide, or a compound of indium oxide and zinc oxide can be used. Since the transparent conductive film is formed after forming the light-emitting layer and the hole injection layer with low heat resistance, the transparent conductive film that can be formed at a possibly low temperature is preferably used.

When the anode 47 is formed, the EL element 4505 is completed. The EL element 4505 refers to a capacitor composed of the pixel electrode (cathode) 43, the light-emitting layer 45, the hole injection layer 46, and the anode 47. As shown in FIG. 24A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the anode 47. As the second passivation film 48, a silicon nitride film or a silicon nitride oxide film is preferably used. The purpose of the second passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display device of the present invention has a pixel portion made of a pixel with a structure as shown in FIG. 23, and includes a TFT for switching having a sufficiently low OFF current value and a TFT for controlling a current that is strong to the injection of hot carriers. Thus, an EL display panel is obtained, which has high reliability and is capable of displaying a satisfactory image.

Embodiment 13

Figure 25:
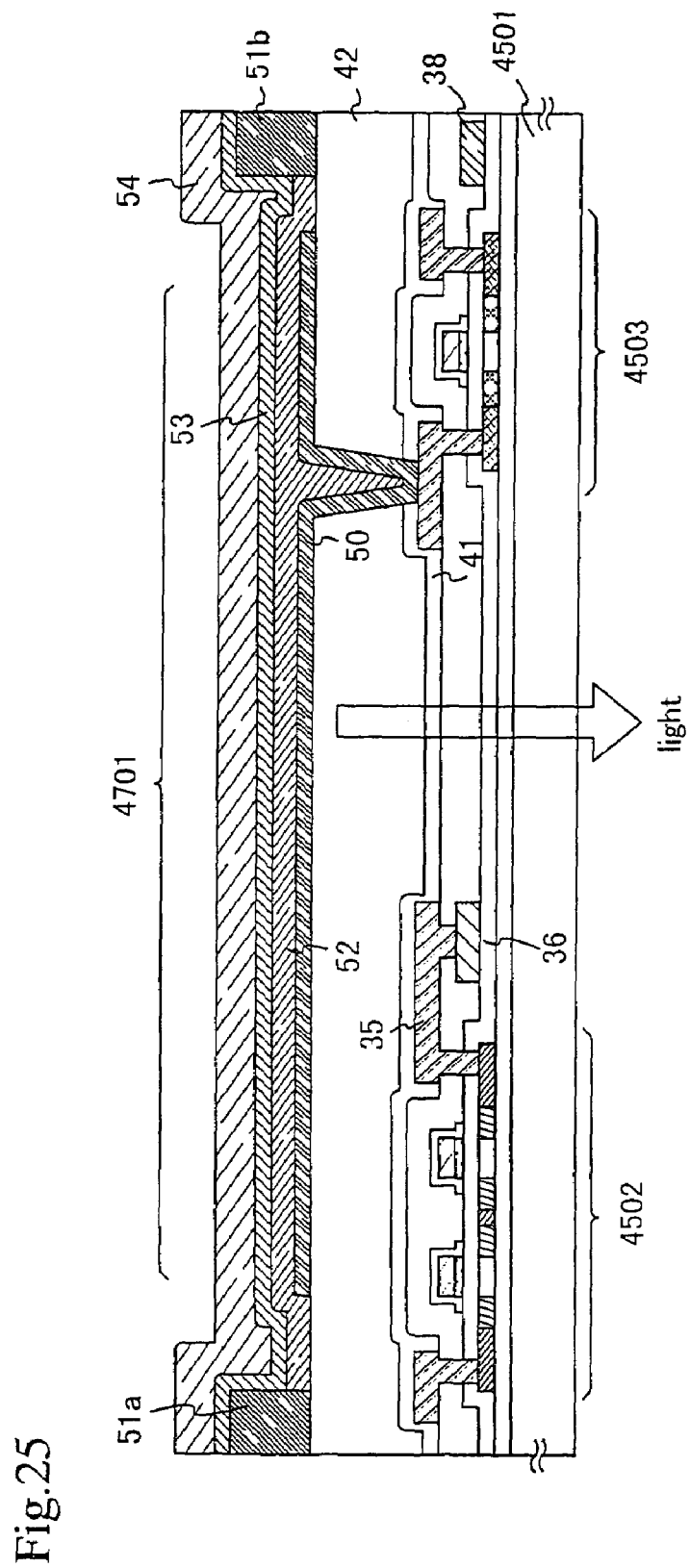
FIG. 25 is a view showing a fabrication example of an EL display device.

A structure in which the structure of the EL element 4505 in the pixel portion shown in the embodiment 12, is inverted is explained in this embodiment. FIG. 25 is used in the explanation. Note that the points of difference between the structure and that of FIG. 23 is only an EL element portion and a TFT for controlling a current, and therefore an explanation of other portions is omitted.

The TFT 4503 for controlling a current uses a p-channel TFT manufactured by a known method in FIG. 25.

A transparent conducting film is used as a pixel electrode (anode) 50 in this embodiment. Specifically, a conducting film made from a compound of indium oxide and zinc oxide is used. Of course, a conducting film made from a compound of indium oxide and tin oxide may also be used.

After then forming banks 51a and 51b made of insulating films, a light emitting layer 52 is formed from polyvinyl carbazole by solution coating. An electron injecting layer 53 is formed on the light emitting layer from potassium acetylacetonate (denoted acacK), and a cathode 54 is formed from an aluminum alloy. In this case the cathode 54 also functions as a passivation film. An EL element 4701 is thus formed.

The light generated by the light emitting layer 52 is radiate toward the substrate on which the TFT is formed in this embodiment, as shown by the arrows.

Embodiment 14

Figure 26A:
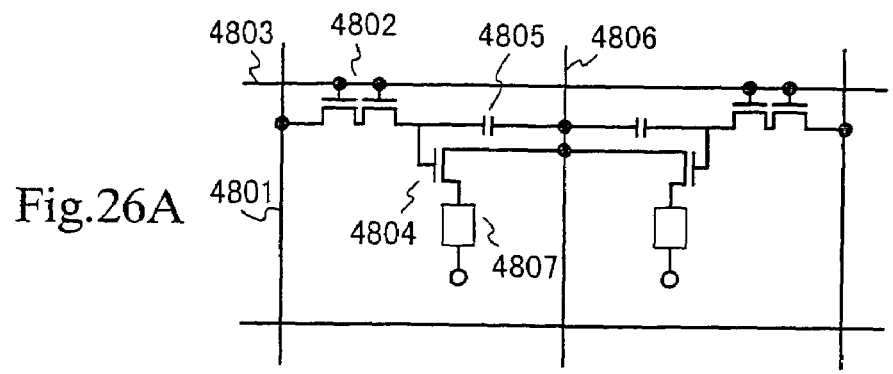
FIGS. 26A to 26C are views showing fabrication examples of EL display devices.
Figure 26B:
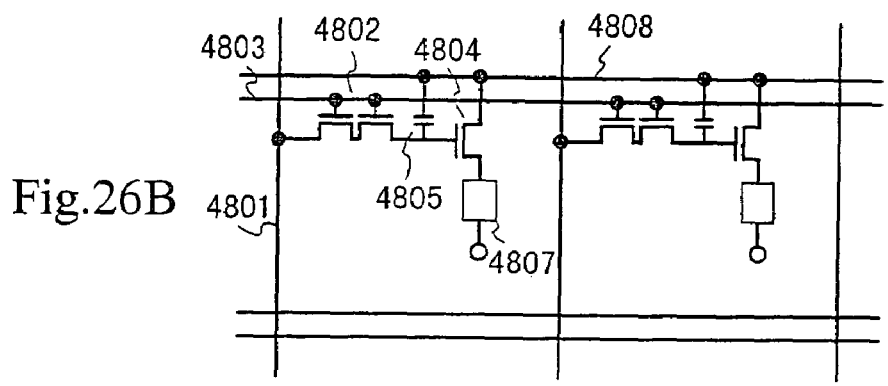
Figure 26C:
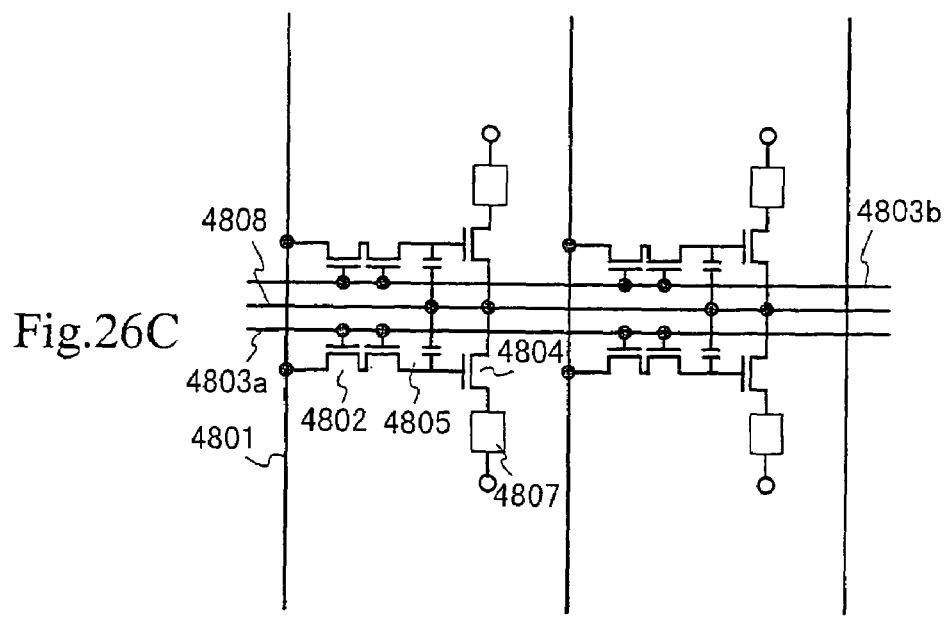

In this embodiment, an example of a case in which a pixel constitution shown in FIGS. 26A to 26C differs from that of the circuit diagram shown in FIG. 24B. Note that in this embodiment, reference numeral 4801 denotes a source line (a source signal line) of a switching TFT 4802, 4803 denotes a gate wiring (a gate signal line) of a switching TFT 4802, 4804 denotes a TFT for controlling a current, 4805 denotes a storage capacitance, 4806 and 4808 denote a power supply line, and 4807 denotes an EL element.

FIG. 26A is an example of a case in which the power supply line 4806 is common between two pixels. Namely, this is characterized in that the two pixels are formed having linear symmetry around the power supply line 4806. In this case, the number of the power supply line can be reduced, and therefore the pixel portion can be made with higher definition.

Further, FIG. 26B is an example of a case in which the power supply line 4808 is formed parallel to the gate wiring (gate signal line) 4803. Note that in FIG. 26B, the structure is formed such that the power supply line 4808 does not overlap with the gate wiring (gate signal line) 4803. In such a case that both wirings are formed in different layer, they can be provided to overlap each other via an insulating film. In this case, the exclusive surface area can be shared by the power supply line 4808 and the gate wiring (gate signal line) 4803, and the pixel portion can be made with higher definition.

Furthermore, FIG. 26C is characterized in that the power supply line 4808 and the gate wiring (gate signal line) 4803 are formed in parallel, similar to the structure of FIG. 26B, and additionally, in that the two pixels are formed so as to have linear symmetry around the power supply line 4808. In addition, it is effective to form the power supply line 4808 so as to overlap with one of the gate wirings (gate signal line) 4803. In this case, the number of the power supply lines can be reduced, and therefore the pixel portion can be made with higher definition Embodiment 15

In FIGS. 24A and 24B described in Embodiment 12, the storage capacitor 4504 is provided so as to hold a voltage applied to a gate electrode of the current controlling TFT 4503. However, the storage capacitor 4504 can be omitted. In Embodiment 12, an LDD region is provided at the drain side of the current controlling TFT 4503 so as to overlap a gate electrode via a gate insulating film. In this overlapping region, a parasitic capacitor called a gate capacitor is generally formed. This embodiment is characterized in that the parasitic capacitor is used positively in place of the storage capacitance 4504.

The capacitance of the parasitic capacitor is varied depending upon the above-mentioned area in which the above-mentioned gate electrode overlaps the LDD region. Therefore, the capacitance is determined by the length of the LDD region included in the region.

In the structure of FIGS. 26A, 26B and 26C described in Embodiment 14, the storage capacitance 4805 can be omitted, similarly.

Embodiment 16

In the present embodiment, a description will be given on an electronic equipment incorporating an active matrix liquid crystal display device or an EL display device using driving method of the present invention. Following can be given as such an electronic equipment: portable information terminals (such as electronic books, mobile computers, and portable telephones); video cameras; digital cameras; personal computers; and TV. Examples of those are shown in FIGS. 27 to 29. FIGS. 27, 28 and 29 show an active matrix liquid crystal display device. FIGS. 27 and 28 show an EL display device.

Figure 27A:
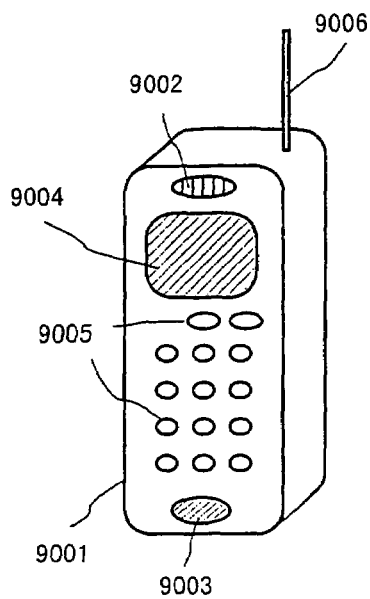
FIGS. 27A to 27F are views showing examples of image display devices.

FIG. 27A is a portable telephone, and is composed of a main body 9001, a voice output portion 9002, a voice input portion 9003, a display portion 9004, operation switches 9005, and an antenna 9006. The present invention can be applied to the display portion 9004.

Figure 27B:
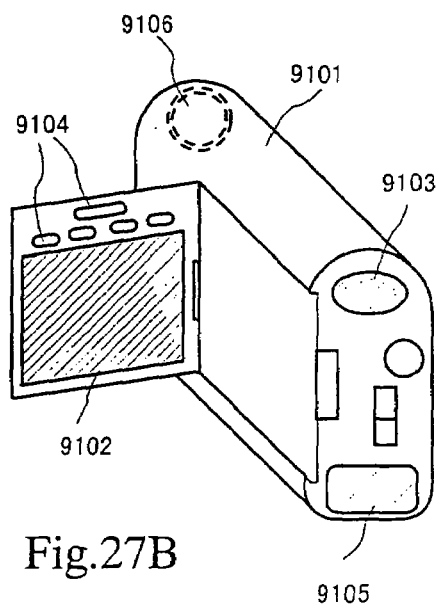

FIG. 27B is a video camera, and is composed of a main body 9101, a display portion 9102, a voice input section 9103, operation switches 9104, a battery 9105 and an image receiving section 9106. The present invention can be applied to the display portion 9102.

Figure 27C:
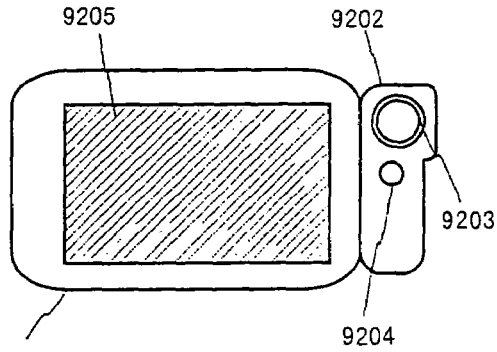

FIG. 27C is a mobile computer or a portable type information terminal which is one of personal computers, and is composed of a main body 9201, a camera portion 9202, an image receiving portion 9203, operation switches 9204, and a display portion 9205. The present invention can be applied to the display portion 9205.

Figure 27D:
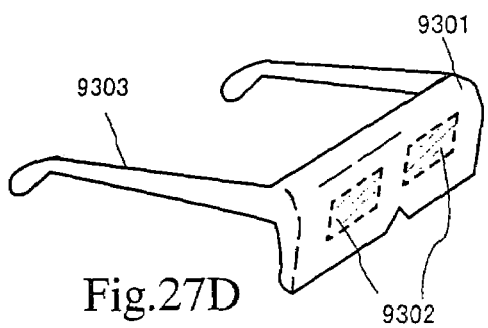

FIG. 27D is a head mount display (a goggle type display), and is composed of a main body 9301, a display portion 9302, and an arm portion 9303. The present invention can be applied to the display portion 9302.

Figure 27E:
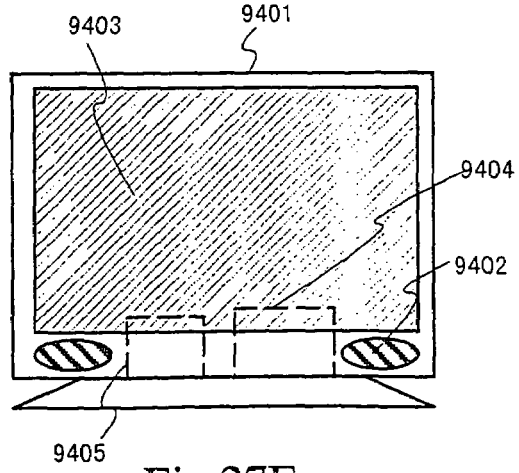

FIG. 27E is a television, and is composed of a main body 9401, speakers 9402, a display portion 9403, a receiving device 9404, and an amplification device 9405. The present invention can be applied to the display portion 9403.

Figure 27F:
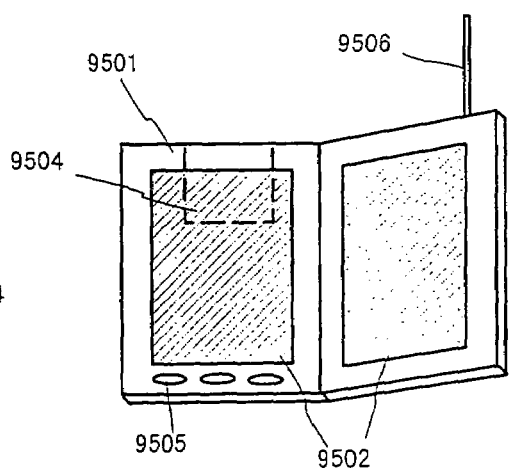

FIG. 27F is a portable electronic book, and is composed of a main body 9501, a display device 9502, a memory medium 9504, an operation switch 9505 and an antenna 9506. The book is used to display data stored in a mini-disk (MD) or a DVD (Digital Versatile Disk), or a data received with the antenna. The present invention can be applied to the display portion 9502.

Figure 28A:
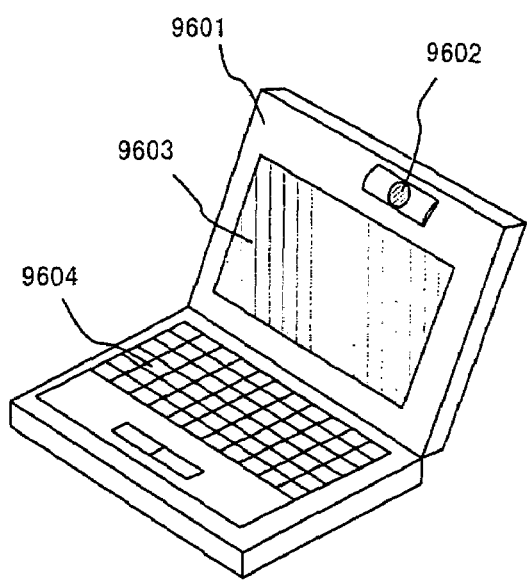
FIGS. 28A to 28D are views showing examples of image display devices.

FIG. 28A is a personal computer, and is composed of a main body 9601, an image inputting portion 9602, a display portion 9603 and a keyboard 9604. The present invention can be applied to the display portion 9603.

Figure 28B:
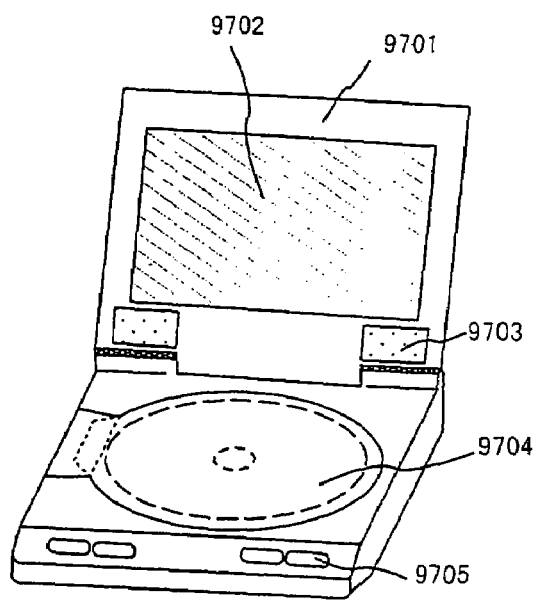

FIG. 28B is a player that employs a recording medium in which programs are recorded (hereinafter, called as a recording medium), and is composed of a main body 9701, a display portion 9702, a speaker portion 9703, a recording medium 9704, and an operation switch 9705. Note that this player uses a DVD (Digital Versatile Disc), CD and the like as the recording medium to appreciate music and films, play games, and connect to the Internet. The present invention can be applied to the display portion 9702.

Figure 28C:
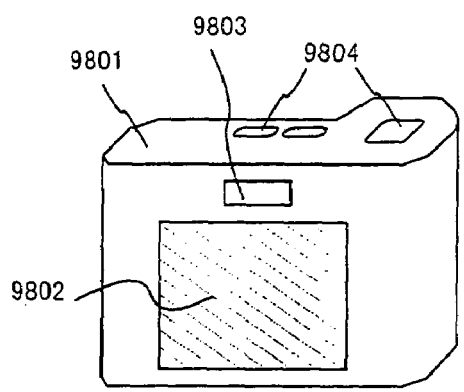

FIG. 28C is a digital camera comprising a main body 9801, a display portion 9802, an eye piece 9803, operation switches 9804, and an image receiving portion (not shown). The present invention can be applied to the display portion 9802.

Figure 28D:
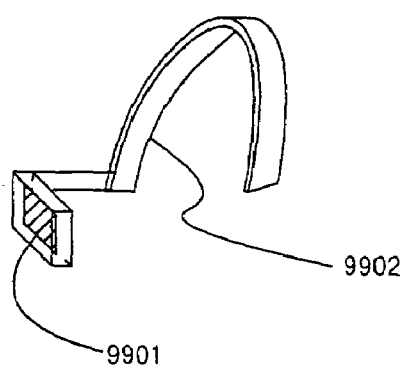

FIG. 28D is a head mount display comprising a display portion 9901, and a head mount portion 9902. The present invention can be applied to the display portion 9901.

Figure 29A:
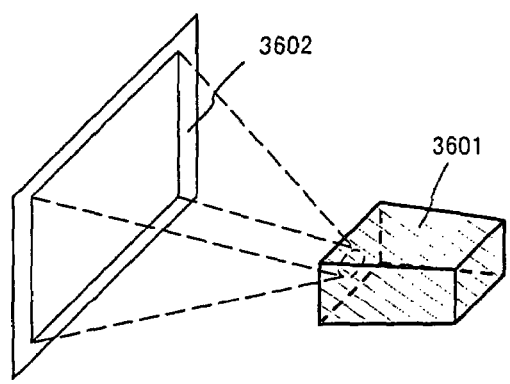
FIGS. 29A to 29D are views showing structures of projection type liquid crystal display devices.

FIG. 29A is a front-type projector comprising a projection device 3601, and a screen 3602.

Figure 29B:
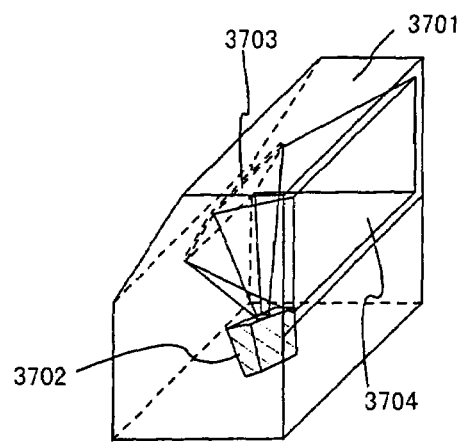

FIG. 29B is a rear-type projector comprising a main body 3701, a projection device 3702, a mirror 3703, and a screen 3704.

Figure 29C:
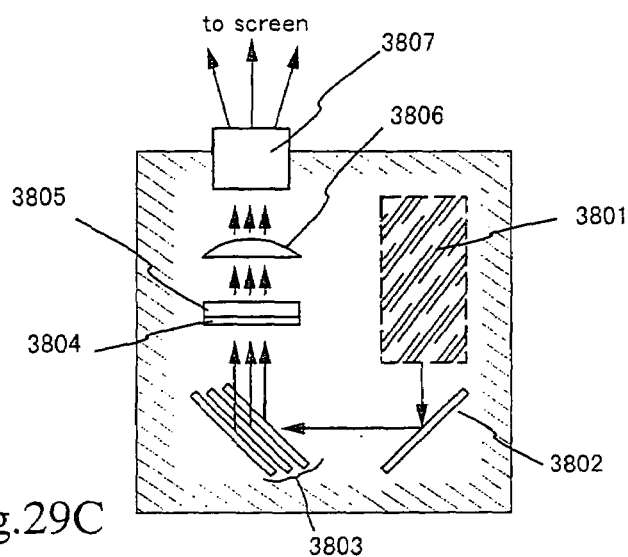

Note that FIG. 29C is a diagram showing an example of the structure of the projection devices 3601 and 3702 in FIGS. 29A and 29B. The projection devices 3601 and 3702 comprise a light source optical system 3801, a mirror 3802, a dichroic mirror 3803, a micro lens array 3804, a liquid crystal display portion 3805, a Fresnel lens 3806 and a projection optical system 3807. The projection optical system 3807 is composed of an optical system including a projection lens. This embodiment shows an example of a single plate type projection device. Further, in the light path indicated by an arrow in FIG. 29C, an optical system such as an optical lens, a film having a polarization function, a film for adjusting a phase difference, and an IR film may be suitably provided by an operator who carries out the invention. The present invention can be applied to the liquid crystal display device 3805.

Figure 29D:
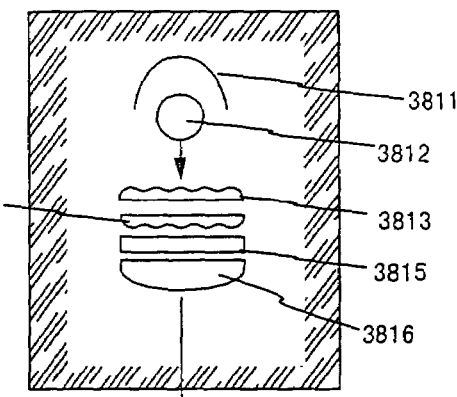
Figure 30:
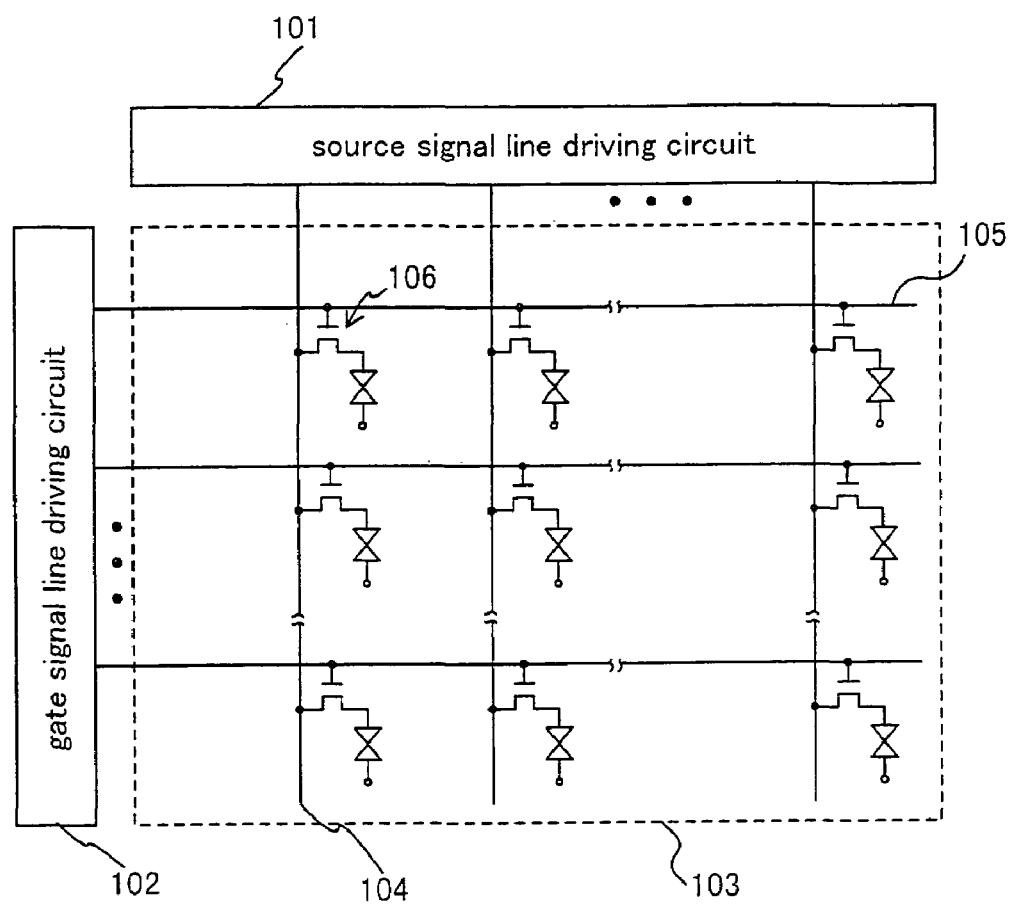
FIG. 30 is a schematic view of an active matrix liquid crystal display device.
Figure 31:
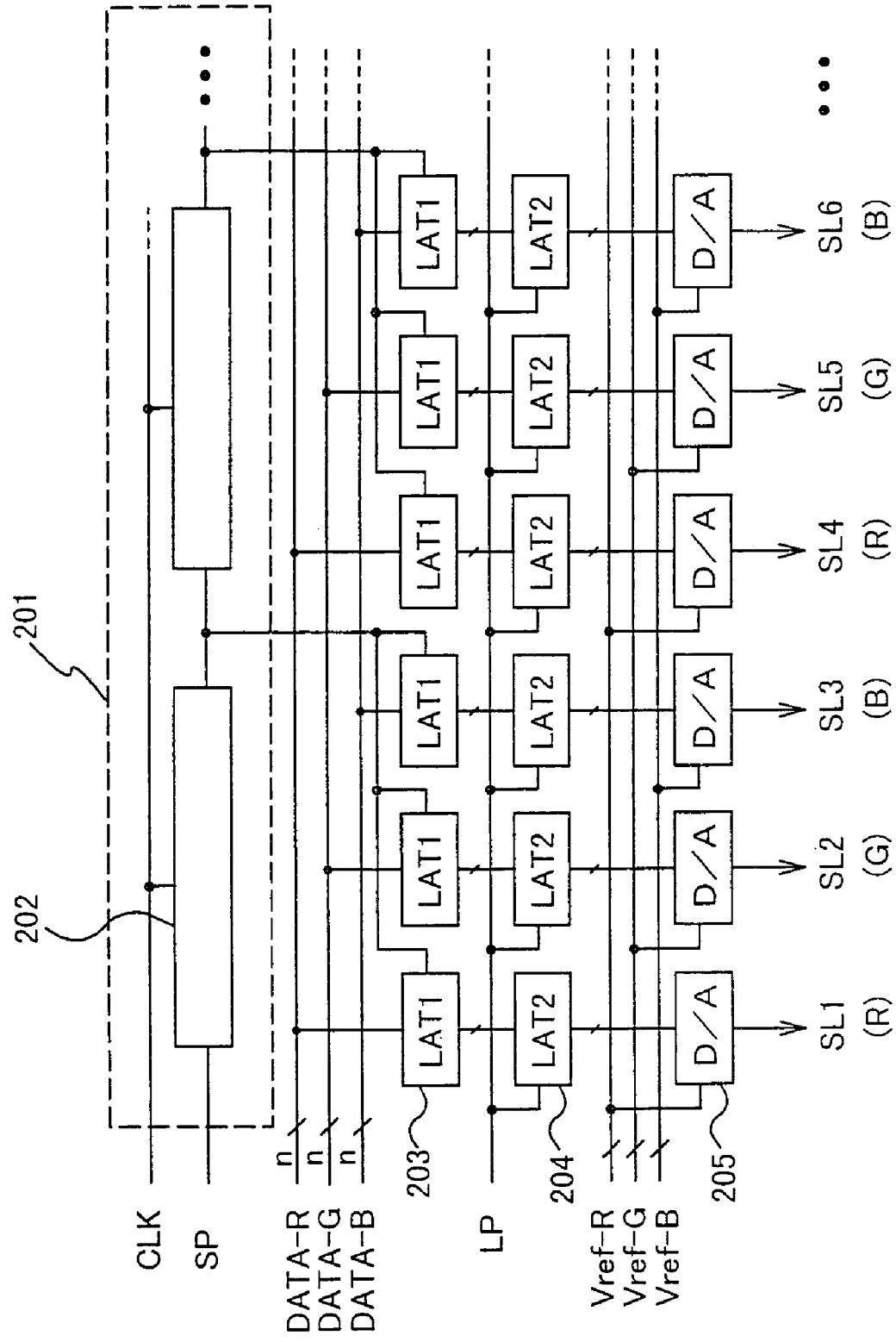
FIG. 31 is a schematic view of a conventional digital system source signal line driving circuit.
Figure 32:
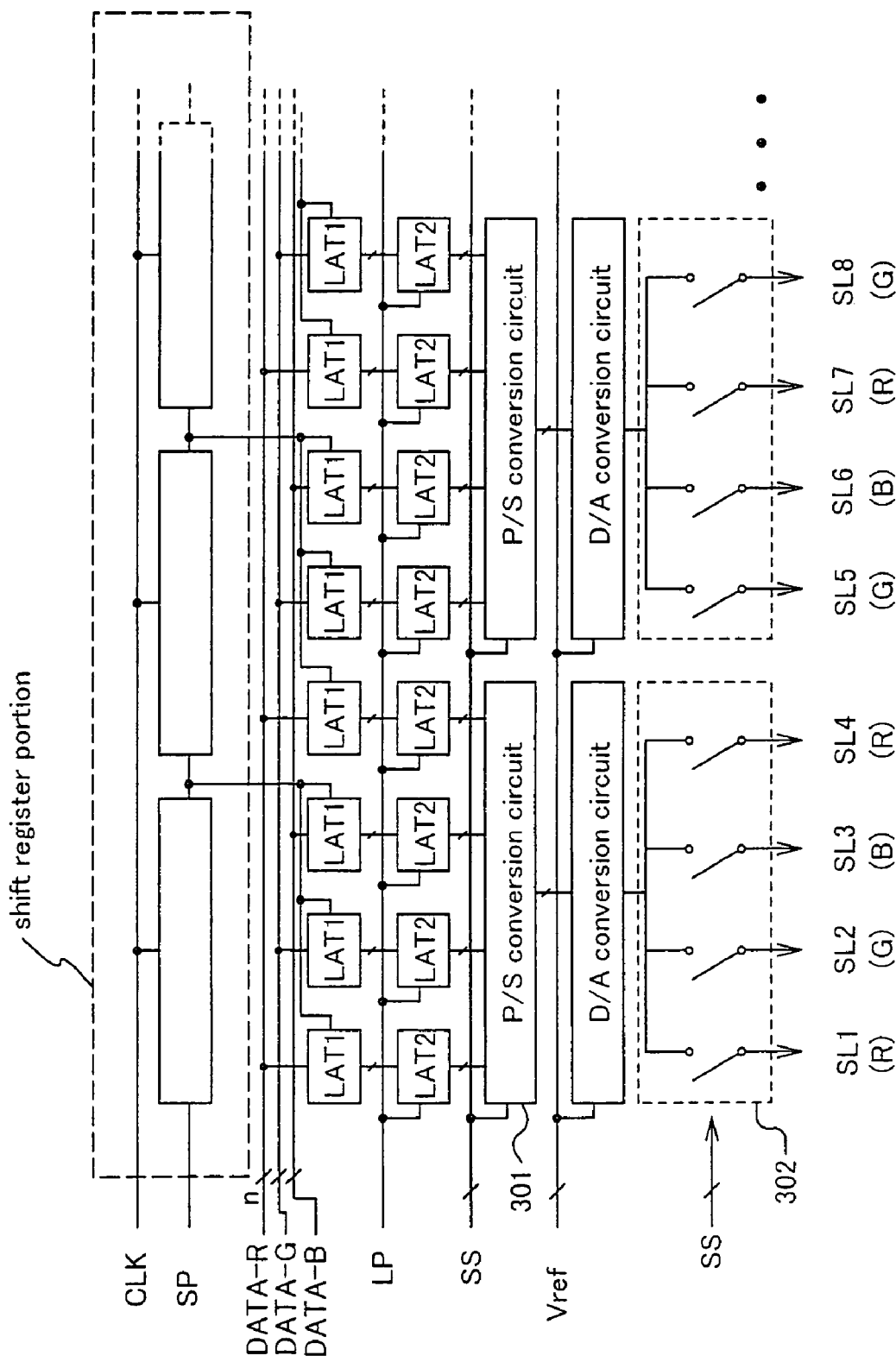
FIG. 32 is a schematic view of a source signal line driving circuit in which one D/A conversion circuit drives four source signal lines.
Figure 33:
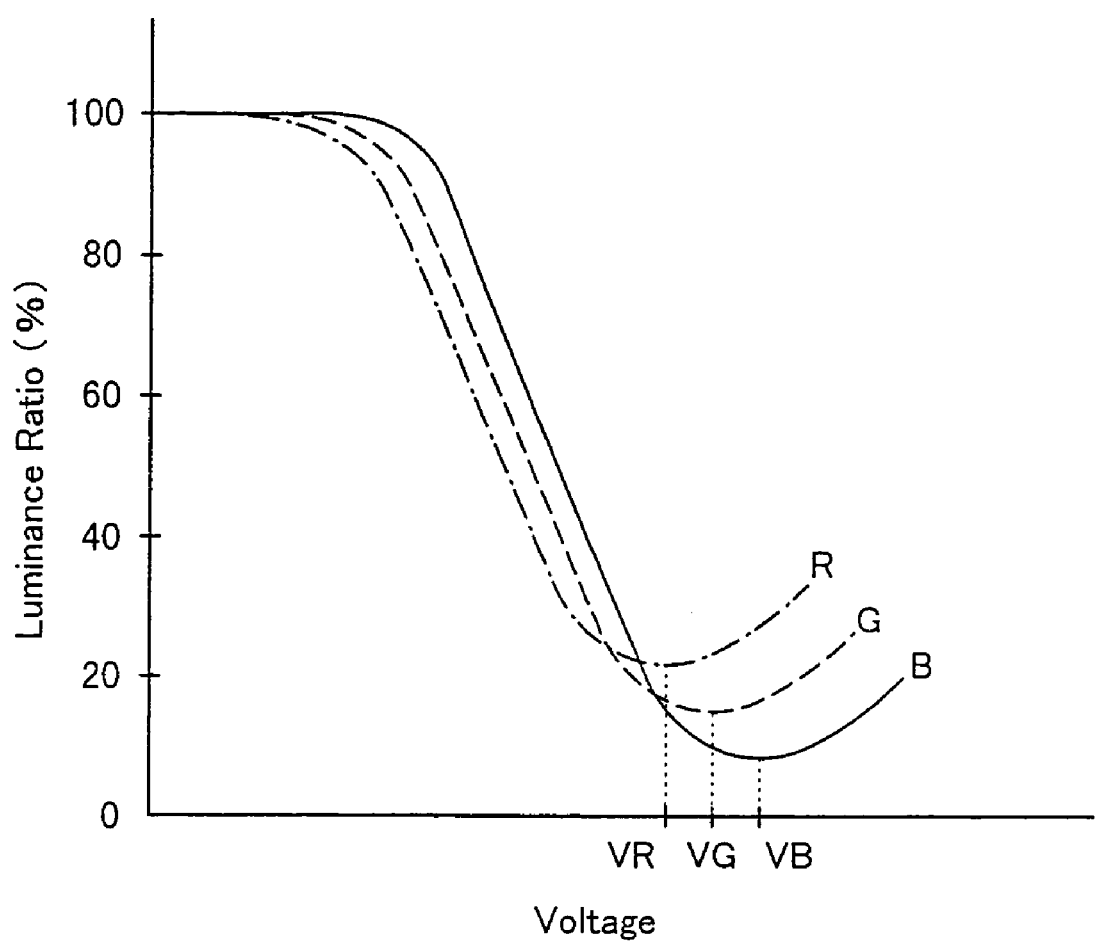
FIG. 33 is a view showing an example of luminance ratio—voltage characteristics for each color in a liquid crystal display device.

Further, FIG. 29D is a diagram showing an example of the structure of the light source optical system 3801 in FIG. 29C. In this embodiment, the light source optical system 3801 comprises a reflector 3811, a light source 3812, lens arrays 3813 and 3814, a polarization conversion element 3815, and a condenser lens 3816. Note that the light source optical system shown in FIG. 29D is merely an example, and is not particularly limited thereto. For example, an operator who carries out the invention is allowed to suitably add an optical system such as an optical lens, a film having a polarization function, a film for adjusting a phase difference, and an IR film to the light source optical system.

The applicable range of the present invention is thus extremely wide, and it is possible to apply the present invention to electronic equipments using an image display device in all fields.

According to the driving method of the present invention, in a method of driving a plurality of source signal lines by one D/A conversion circuit, it becomes possible to control voltages applied to pixels independently for RGB without increasing the number of external input pins and without increasing an occupied area of a driving circuit.

Besides, it becomes possible to prevent lowering of contrast and to display a picture in which the expression of a color is superior and the quality is high.

What is claimed is:

1. A digital camera comprising:
   a body; and
   a display attached to the body, said display comprising:
   a pixel array portion including a plurality of source signal lines, a plurality of gate signal lines, a plurality of pixel electrodes provided in respective regions where the respective source signal lines and the respective gate signal lines intersect with each other, and a plurality of switching elements for driving the plurality of pixel electrodes;
   a source signal line driving circuit for driving the plurality of source signal lines; and
   a gate signal line driving circuit for driving the plurality of gate signal lines,
   wherein the source signal line driving circuit includes a plurality of D/A conversion circuits and a plurality of source line selecting circuits,
   wherein each of the D/A conversion circuits is connected to the source signal lines, in which three source signal lines corresponding to three colors of R (red), G (green) and B (blue) are made a unit and the number of which is a multiple of three, through each of the source line selecting circuits,
   wherein gray-scale power supply lines connected to the respective D/A conversion circuits are one system, and
   wherein power supply voltages corresponding to the three colors of the RGB are applied to the gray-scale power supply lines in one gate line selecting period.

2. The digital camera according to claim 1, wherein:
   in the one gate line selecting period, the respective source line selecting circuits sequentially select the source signal lines, the number of which is a multiple of three, to connect them to the respective D/A conversion circuits while all the source line selecting circuits synchronize with each other; and
   in respective selecting periods, all the source signal lines connected to the respective D/A conversion circuits are corresponding to the same color with respect to the RGB, and the power supply voltage corresponding to the color is applied to the gray-scale power supply lines.

3. The digital camera according to claim 1, wherein:
   the respective D/A conversion circuits are connected to the source signal lines, the number of which is 6 or more and is a multiple of 3, through the respective source line selecting circuits; and
   the respective source line selecting circuits continuously select the source signal lines corresponding to the same color with respect to the RGB and connect them to the respective D/A conversion circuits.

4. The digital camera according to claim 1, wherein:
   the one gate line selecting period is divided into three periods of first, second and third periods;
   in the first period, a power supply voltage corresponding to a first color of the three colors (RGB) is applied to the gray-scale power supply lines, and at the same time, the respective source line selecting circuits select the one or plural source signal lines corresponding to the first color to connect them to the respective D/A conversion circuits;

in the second period, a power supply voltage corresponding to a second color of the three colors (RGB) is applied to the gray-scale power supply lines, and at the same time, the respective source line selecting circuits select the one or plural source signal lines corresponding to the second color to connect them to the respective D/A conversion circuits; and in the third period, a power supply voltage corresponding to a third color of the three colors (RGB) is applied to the gray-scale power supply lines, and at the same time, the respective source line selecting circuits select the one or plural source signal lines corresponding to the third color to connect them to the respective D/A conversion circuits.

5. The digital camera according to claim 1, wherein a liquid crystal material is used for a display element.

6. The digital camera according to claim 1, wherein an electro luminescence (EL) material is used for a display element.

7. A portable telephone comprising:
a body; and
a display attached to the body, said display comprising:
a pixel array portion including a plurality of source signal lines, a plurality of gate signal lines, a plurality of pixel electrodes provided in respective regions where the respective source signal lines and the respective gate signal lines intersect with each other, and a plurality of switching elements for driving the plurality of pixel electrodes;
a source signal line driving circuit for driving the plurality of source signal lines; and
a gate signal line driving circuit for driving the plurality of gate signal lines,
wherein the source signal line driving circuit includes a plurality of D/A conversion circuits and a plurality of source line selecting circuits,
wherein each of the D/A conversion circuits is connected to the source signal lines, in which three source signal lines corresponding to three colors of R (red), G (green) and B (blue) are made a unit and the number of which is a multiple of three, through each of the source line selecting circuits,
wherein gray-scale power supply lines connected to the respective D/A conversion circuits are one system, and
wherein power supply voltages corresponding to the three colors of the RGB are applied to the gray-scale power supply lines in one gate line selecting period.

8. The portable telephone according to claim 7, wherein:
in the one gate line selecting period, the respective source line selecting circuits sequentially select the source signal lines, the number of which is a multiple of three, to connect them to the respective D/A conversion circuits while all the source line selecting circuits synchronize with each other; and
in respective selecting periods, all the source signal lines connected to the respective D/A conversion circuits are corresponding to the same color with respect to the RGB, and the power supply voltage corresponding to the color is applied to the gray-scale power supply lines.

9. The portable telephone according to claim 7, wherein:
the respective D/A conversion circuits are connected to the source signal lines, the number of which is 6 or more and is a multiple of 3, through the respective source line selecting circuits; and
the respective source line selecting circuits continuously select the source signal lines corresponding to the same color with respect to the RGB and connect them to the respective D/A conversion circuits.

10. The portable telephone according to claim 7, wherein:
the one gate line selecting period is divided into three periods of first, second and third periods;
in the first period, a power supply voltage corresponding to a first color of the three colors (RGB) is applied to the gray-scale power supply lines, and at the same time, the respective source line selecting circuits select the one or plural source signal lines corresponding to the first color to connect them to the respective D/A conversion circuits;
in the second period, a power, supply voltage corresponding to a second color of the three colors (RGB) is applied to the gray-scale power supply lines, and at the same time, the respective source line selecting circuits select the one or plural source signal lines corresponding to the second color to connect them to the respective D/A conversion circuits; and
in the third period, a power supply voltage corresponding to a third color of the three colors (RGB) is applied to the gray-scale power supply lines, and at the same time, the respective source line selecting circuits select the one or plural source signal lines corresponding to the third color to connect them to the respective D/A conversion circuits.

11. The portable telephone according to claim 7, wherein a liquid crystal material is used for a display element.

12. The portable telephone according to claim 7, wherein an electro luminescence (EL) material is used for a display element.

13. A personal computer comprising a display, said display comprising:
a pixel array portion including a plurality of source signal lines, a plurality of gate signal lines, a plurality of pixel electrodes provided in respective regions where the respective source signal lines and the respective gate signal lines intersect with each other, and a plurality of switching elements for driving the plurality of pixel electrodes;
a source signal line driving circuit for driving the plurality of source signal lines; and
a gate signal line driving circuit for driving the plurality of gate signal lines,
wherein the source signal line driving circuit includes a plurality of D/A conversion circuits and a plurality of source line selecting circuits,
wherein each of the D/A conversion circuits is connected to the source signal lines, in which three source signal lines corresponding to three colors of R (red), G (green) and B (blue) are made a unit and the number of which is a multiple of three, through each of the source line selecting circuits,
wherein gray-scale power supply lines connected to the respective D/A conversion circuits are one system, and
wherein power supply voltages corresponding to the three colors of the RGB are applied to the gray-scale power supply lines in one gate line selecting period.

14. The personal computer according to claim 13, wherein:
in the one gate line selecting period, the respective source line selecting circuits sequentially select the source signal lines, the number of which is a multiple of three, to connect them to the respective D/A conversion circuits while all the source line selecting circuits synchronize with each other; and in respective selecting periods, all the source signal lines connected to the respective D/A conversion circuits are corresponding to the same color with respect to the RGB, and the power supply voltage corresponding to the color is applied to the gray-scale power supply lines.

15. The personal computer according to claim 13, wherein:

the respective D/A conversion circuits are connected to the source signal lines, the number of which is 6 or more and is a multiple of 3, through the respective source line selecting circuits; and the respective source line selecting circuits continuously select the source signal lines corresponding to the same color with respect to the RGB and connect them to the respective D/A conversion circuits.

16. The personal computer according to claim 13, wherein:

the one gate line selecting period is divided into three periods of first, second and third periods;

in the first period, a power supply voltage corresponding to a first color of the three colors (RGB) is applied to the gray-scale power supply lines, and at the same time, the respective source line selecting circuits select the one or plural source signal lines corresponding to the first color to connect them to the respective D/A conversion circuits;

in the second period, a power supply voltage corresponding to a second color of the three colors (RGB) is applied to the gray-scale power supply lines, and at the same time, the respective source line selecting circuits select the one or plural source signal lines corresponding to the second color to connect them to the respective D/A conversion circuits; and in the third period, a power supply voltage corresponding to a third color of the three colors (RGB) is applied to the gray-scale power supply lines, and at the same time, the respective source line selecting circuits select the one or plural source signal lines corresponding to the third color to connect them to the respective D/A conversion circuits.

17. The personal computer according to claim 13, wherein a liquid crystal material is used for a display element.

18. The personal computer according to claim 13, wherein an electro luminescence (EL) material is used for a display element.

* * * * *

UNITED STATES PATENT AND TRADEMARK OFFICE
CERTIFICATE OF CORRECTION

PATENT NO.       : 7,053,918 B2                                            Page 1 of 1
APPLICATION NO.  : 10/795240
DATED            : May 30, 2006
INVENTOR(S)      : Munehiro Azami It is certified that error appears in the above-identified patent and that said Letters Patent is hereby corrected as shown below:

Column 5, line 26, replace "k is an integer larger than and equal to 0" with --k is an integer larger than or equal to 0--.

Signed and Sealed this

Twenty-first Day of November, 2006

JON W. DUDAS
*Director of the United States Patent and Trademark Office*